United States Patent
Nagasawa

(10) Patent No.: US 8,497,666 B2
(45) Date of Patent: Jul. 30, 2013

(54) SEMICONDUCTOR DEVICE AND POWER SOURCE DEVICE

(75) Inventor: Toshio Nagasawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 394 days.

(21) Appl. No.: 12/980,529

(22) Filed: Dec. 29, 2010

(65) Prior Publication Data

US 2011/0169471 A1    Jul. 14, 2011

(30) Foreign Application Priority Data

Jan. 14, 2010   (JP) .................................. 2010-005956

(51) Int. Cl.
*G05F 1/10*    (2006.01)
*H02M 1/00*   (2007.01)

(52) U.S. Cl.
USPC ........... 323/238; 323/246; 323/285; 323/321; 323/351; 363/49

(58) Field of Classification Search
USPC ................... 363/49; 323/237–246, 282–285, 323/288, 290, 320–327, 351
See application file for complete search history.

(56) References Cited

U.S. PATENT DOCUMENTS

| | | | |
|---|---|---|---|
| 6,703,879 B2 * | 3/2004 | Okuda et al. .................. | 327/158 |
| 7,773,400 B2 * | 8/2010 | Nakamori et al. ............ | 363/132 |
| 2007/0064456 A1 | 3/2007 | Schuellein | |
| 2008/0231247 A1 * | 9/2008 | Uehara .......................... | 323/284 |
| 2011/0031949 A1 * | 2/2011 | Zhang et al. ................... | 323/282 |
| 2011/0062927 A1 * | 3/2011 | Nagasawa et al. ............. | 323/282 |

FOREIGN PATENT DOCUMENTS

| | | |
|---|---|---|
| JP | 2006-50891 A | 2/2006 |
| JP | 2007-135390 A | 5/2007 |
| JP | 2009-219184 A | 9/2009 |

\* cited by examiner

*Primary Examiner* — Jessica Han
(74) *Attorney, Agent, or Firm* — Mattingly & Malur, PC

(57) ABSTRACT

A multi-phase power source device capable of easily changing the number of phases is realized. For example, a plurality of drive units POL[1]-POL[4] corresponding to the number of phases are provided, wherein each POL[n] receives a phase input signal PHI[n] serving as a pulse signal, and generates a phase output signal PHO[n] by delaying PHI[n] by a predetermined cycles of a clock signal CLK. PHI[n] and PHO[n] of each POL[n] are coupled in a ring, wherein each POL[n] performs a switching operation with PHI[n] or PHO[n] as a starting point. In this case, each POL[n] charges and discharges a capacitor Cct commonly coupled to each POL[n] with an equal current, and a frequency of CLK is determined based on this charge and discharge rate. That is, if the number of phases increases n times, the frequency of CLK will be automatically controlled to n times.

17 Claims, 20 Drawing Sheets

SEMICONDUCTOR DEVICE AND POWER SOURCE DEVICE

CROSS-REFERENCE TO RELATED APPLICATION

The disclosure of Japanese Patent Application No. 2010-5956 filed on Jan. 14, 2010 including the specification, drawings and abstract is incorporated herein by reference in its entirety.

BACKGROUND OF THE INVENTION

The present invention relates to semiconductor devices and power source devices using the same, and relates to, for example, a technique effectively applied to a switching power source device for converting a high voltage to a low voltage.

For example, Japanese Patent Laid-Open No. 2009-219184 (Patent Document 1) describes a multi-phase power source, wherein a plurality of semiconductor devices corresponding to the respective phases is coupled in a ring (FIG. 1). Moreover, Japanese Patent Laid-Open No. 2006-50891 (Patent Document 2) describes a multi-phase type DC/DC converter device, wherein a plurality of converter control ICs is used to supply an electric power to a load using different phases, respectively (FIG. 1). Moreover, Japanese Patent Laid-Open No. 2007-135390 (Patent Document 3) describes a multi-phase converter comprising n phase ICs and a control IC supplying a common control signal to each phase IC (FIG. 1, FIG. 2).

SUMMARY OF THE INVENTION

For example, on a wiring board (a mother board or the like) PCB for a personal computer (hereinafter, PC), a server, or the like, various types of circuit units represented by a DDR-SDRAM (Double-Data-Rate Synchronous Dynamic Random Access Memory), a CPU (Central Processing Unit), and the like are mounted. The power sources for such various types of circuit units are provided by a step-down non-insulated DC/DC converter (buck converter) called a POL (Point Of Load) converter or the like mounted in a vicinity of the various types of circuit units on the wiring board PCB.

In recent years, in various types of circuit units, the operation frequency increases every year for the purpose of improving the throughput, and the power source voltage is becoming lower. Thus, the consumption current of various types of circuit units tends to increase with an increase in the operation frequency, and the leakage current also tends to increase with a decrease in the power source voltage. In order to cope with such an increase in the current and a decrease in the voltage, the POL converter increasingly employs the so-called multi-phase wherein an electric power is sequentially supplied using a plurality of phases. If the multi-phase type POL converter is used, the mounting area required on a wiring board PCB increases with an increase in the number of phases. On the other hand, the mounting area assigned to the POL converter tends to decrease with the diversification of a system or a reduction in the size of electronic devices. Accordingly, a reduction in the area (a reduction in the size) of the multi-phase type POL converter is critical.

In addition, the environmental problem is of concern in recent years. In various types of circuit units as described above, a power saving design is performed, wherein only necessary minimum circuit blocks are activated in response to a status of the system, and accordingly the range of fluctuation of the consumption current (current range) is expanding. Correspondingly, the POL converter is required to improve the power conversion efficiency in a wide range of current. In the multi-phase type POL converter, the more the number of phases is increased, the higher current can be handled. However, if a light load (various types of circuit units with a small consumption current) is driven under this condition, the power conversion efficiency will decrease. That is, because there is the number of phases which optimizes the power conversion efficiency in response to the consumption current of a load, the POL converter is preferably configured so as to be able to dynamically change the number of phases.

FIG. 19A shows a power source device studied as a prerequisite to the present invention and is a block diagram showing an example of the outline configuration thereof, and FIG. 19B is a waveform chart showing an operation example of the power source device of FIG. 19A. The power source device shown in FIG. 19A comprises a control unit CTLU, a plurality of (here, four) drive units POLb[1]-POLb[4], a plurality of inductors L[1]-L[4] whose one ends are commonly coupled to an output power source node VO, and a capacitor Cld whose one end is coupled to VO. CTLU outputs phase input signals PHI[1]-PHI[4], whose phases differ in units of 90°, respectively, to POLb[1]-POLb[4]. POLb[1]-POLb[4] respectively perform a predetermined operation with PHI[1]-PHI[4] as a starting point, and control a current flowing into L[1]-L[4] via switch signals SW[1]-SW[4]. The current with each phase different in units of 90° flows through L[1]-L[4], respectively, and a part thereof is supplied to a load LOD corresponding to the above-described various types of circuit units and other part thereof is supplied to the capacitor Cld. LOD, with the voltage of VO as its power source voltage, performs a predetermined operation using a power source current supplied from L[1]-L[4] and Cld.

If the power source device (multi-phase type POL converter) as shown in FIGS. 19A and 19B is used, then, for example, the number of phases may be changed by adequately changing the waveform states of the phase input signals PHI[1]-PHI[4]. However, because the control unit CTLU is essential, the mounting area therefor makes it difficult to achieve a reduction in the size of the power source device. Moreover, the change range of the number of phases is limited by the number of pins of CTLU, and therefore, for example, when the number of phases is desired to be increased, there is also a need to add CTLU. Then, as shown in FIGS. 20A and 20B, a configuration not using the control unit CTLU can be conceivable.

FIG. 20A shows another power source device studied as a prerequisite to the present invention and is a block diagram showing an example of the outline configuration thereof, and FIG. 20B is a waveform chart showing an operation example of FIG. 20A. The power source device shown in FIG. 20A comprises a plurality of (here, four) drive units POLa[1]-POLa[4], the inductors L[1]-L[4] whose one ends are commonly coupled to the output power source node VO, and the capacitor Cld whose one end is coupled to VO. POLa[1] generates a clock signal CLK with a frequency corresponding to a capacitor Cct coupled outside, and supplies this CLK commonly to POLa[2]-POLa[4].

Moreover, POLa[n] (n=1-4) receives a phase input signal PHI[n] serving as a one-shot pulse signal, and outputs a phase output signal PHO[n] which is a signal obtained by delaying the phase input signal PHI[n] by one cycle of CLK. Assuming PHO[n]=PHI[n+1], then by feeding back PHO[4] of the final stage to PHI[1] of the first stage, PHI[1]-PHI[4] serve as signals whose phases differ in units of 90°, respectively. Each POLa[n] performs an operation similar to that of FIGS. 19A and 19B, with PHI[n] (or PHO[n]) as a starting point, and the load LOD coupled to the output power source node VO is driven by the resulting multi-phase operation.

If the power source device (multi-phase type POL converter) as shown in FIGS. 20A and 20B is used, the control unit CTLU is not required and therefore a reduction in the size of the power source device can be achieved. The power source device of FIG. 20A does not cause any specific problem if the number of phases is fixed, however, if the number of phases is desired to be changed, then an adequate realization means therefor is required.

Then, the present invention has been made in view of the above circumstances and provides a multi-phase power source device capable of easily changing the number of phases and a semiconductor device serving as a constituent element thereof. In addition, the other purposes and the new feature of the present invention will become clear from the description of the present specification and the accompanying drawings.

The following explains briefly the outline of an embodiment of a typical invention among the inventions disclosed in the present application.

A power source device according to this embodiment realizes a switching operation with a maximum of m phases using m semiconductor devices. Each semiconductor device includes a high side transistor and a low side transistor, first to fourth terminals, a charge and discharge circuit, a clock signal generation circuit, a first switch, a pulse signal generation circuit, and a PWM control circuit. The charge and discharge circuit includes a constant current source determining a charge rate or a discharge rate, and a changeover switch switching between charge and discharge. The charge and discharge circuit charges and discharges the first terminal. The clock signal generation circuit generates a first clock signal by determining a voltage level of the first terminal. A common clock signal is transmitted to the second terminal. The first switch, when turned on, couples the clock signal generation circuit to the second terminal, and transmits the first clock signal as the common clock signal. The pulse signal generation circuit delays a pulse input signal input from the third terminal by a predetermined cycles of the common clock signal, and transmits the resulting pulse output signal to the fourth terminal. The PWM control circuit generates a PWM signal, with the pulse input signal or the pulse output signal as a starting point, and controls switching of the high side transistor and the low side transistor.

Here, the second terminals of the respective semiconductor devices are commonly coupled to each other. Moreover, the fourth terminal of the semiconductor device in a k-th stage is sequentially coupled to the third terminal of the semiconductor device in a (k+1) stage, and the fourth terminal of the semiconductor device in an m-th stage serving as the final stage is fed back to the third terminal of the semiconductor device in the first stage. With such loop connection, the pulse input signal (or pulse output signal) in each semiconductor device differs in a predetermined unit of phase, which makes it possible to realize the multi-phase operation.

Moreover, the first terminal of each semiconductor device is commonly coupled to an external capacitor, the first switch of the first stage semiconductor device is turned on and the first switches of the other semiconductor devices are turned off. Thereby, a common clock signal is output from the clock signal generation circuit of the first stage semiconductor device toward each semiconductor device. If the number of semiconductor devices commonly coupled to the external capacitor described above (i.e., the number of phases) increases n times, the charge rate and/or the discharge rate automatically increases n times and therefore the frequency of this common clock signal increases n times. By automatically changing the frequency of the common clock signal to n times in response to the number of phases n in this manner, the multi-phase operation at a predetermined switching frequency can be easily realized without depending on the number of phases.

Furthermore, in the above-described power source device, it is preferable to provide the second switch between the charge and discharge circuit and the first terminal and additionally provide a switch circuit which short-circuits between the third terminal and the fourth terminal and blocks electrical conduction between the pulse signal generation circuit and the fourth terminal, in each semiconductor device. The second switch and the switch circuit are controlled, so that the number of phases can be dynamically changed in response to the consumption current of an external load and an improvement in the power conversion efficiency can be achieved. Note that, for example, the dynamic change of the number of phases, when each semiconductor device performs the switching operation according to the so-called peak current control method, may be automatically performed by monitoring a determination voltage level in determining this peak current.

To explain briefly the effect acquired by the typical embodiment among the inventions disclosed in the present application, the number of phases can be easily changed in a multi-phase power source device.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly instructed in particular and where they are clearly restricted to a specific number theoretically.

Furthermore, in the following embodiments, it is needless to say that an element (including an element step etc.) is not necessarily indispensable, except for the case where it is clearly instructed in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Moreover, the circuit elements constituting each functional block of the embodiments are not limited in particular, but are formed above a semiconductor substrate of single crystal silicon or the like using an integrated circuit technique for a CMOS (complementary MOS transistor) or the like. Note that, when a MOSFET (Metal Oxide Semiconductor Field Effect Transistor) (or abbreviated as an MOS transistor) is referred to in the embodiments, a non-oxide film is not excluded as the gate insulating film.

Hereinafter, the embodiments of the present invention will be described in detail in accordance with the accompanying drawings. In all the drawings for explaining embodiments, the same symbol is attached to the same member, as a principle, and the repeated explanation thereof is omitted.

Embodiment 1

<<Outline Configuration of the Whole Power Source Device>>

Figure 1:
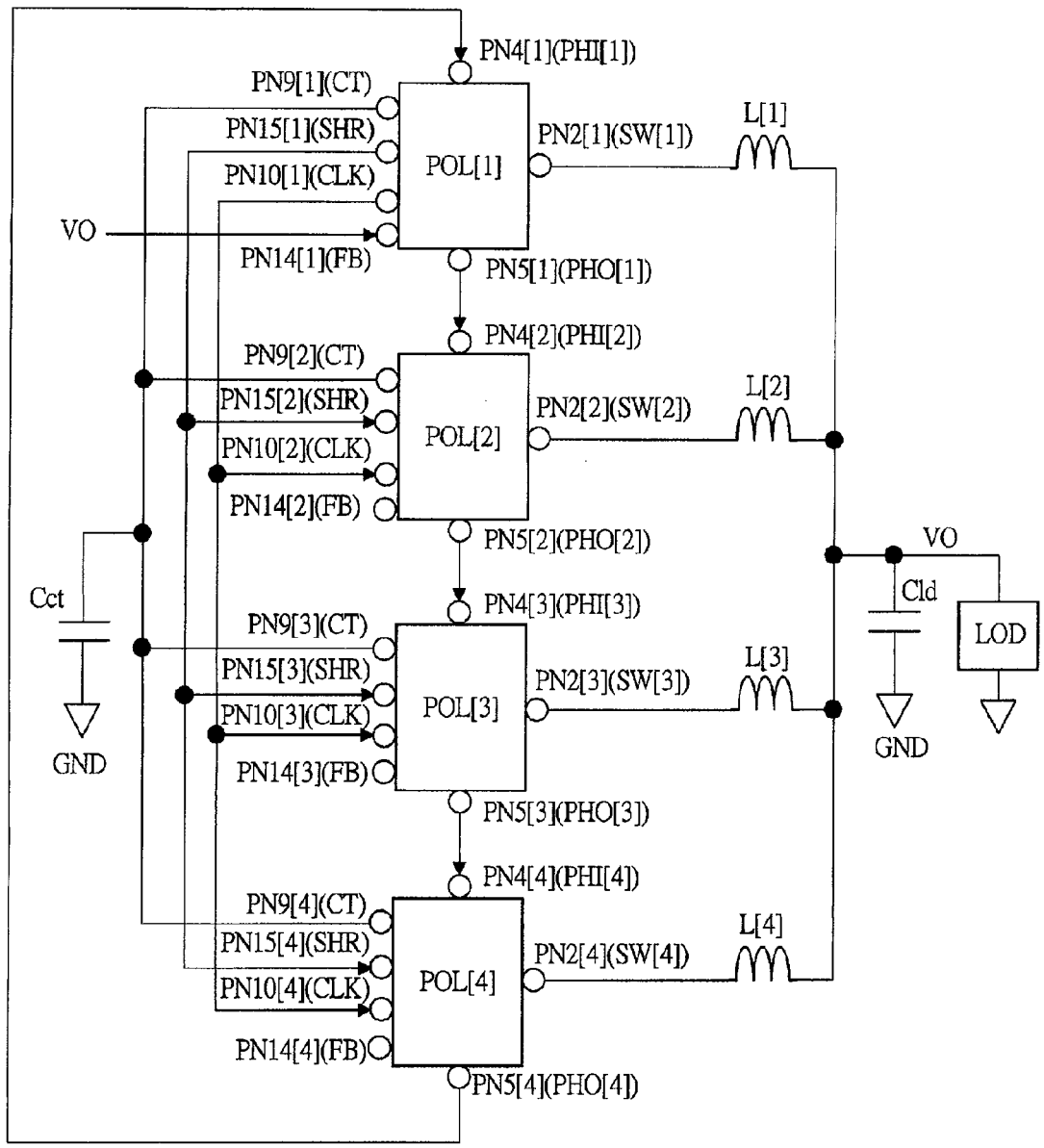
FIG. 1 is a block diagram showing an example of the outline configuration of a power source device according to Embodiment 1 of the present invention.

FIG. 1 is a block diagram showing an example of the outline configuration of a power source device according to Embodiment 1 of the present invention. The power source device shown in FIG. 1 comprises a plurality of (here, four) drive units (semiconductor devices) POL[1]-POL[4] and a plurality of inductors L[1]-L[4], and capacitors Cct, Cld. Each drive unit POL[n] (n=1-4) has an identical internal configuration, and includes seven external terminals PN2[n], PN4[n], PN5[n], PN9[n], PN10[n], PN14[n], and PN15[n]. POL[1] serves as a master drive unit, and POL[2]-POL[4] serve as a slave drive unit, respectively. One ends of L[1]-L[4] are commonly coupled to an output power source node VO, and the other ends of each L[n] are individually coupled to PN2[n], respectively. Cld is provided between VO and a ground power source voltage GND.

The external terminal PN9[n] of each POL[n] is commonly coupled to one end of the capacitor Cct, through which a clock control signal CT is transmitted. The other end of Cct is coupled to the ground power source voltage GND. POL[1] generates the clock signal CLK based on the CT, and outputs this CLK from the external terminal PN10[1]. CLK from POL[1] is input to POL[2]-POL[4] via the external terminals PN10[2]-PN10[4].

The phase input signal PHI[n] serving as a one-shot pulse signal is input to the external terminal PN4[n] of each POL [n]. Each POL[n] delays this PHI [n] by a predetermined cycles of CLK (typically, one cycle), and outputs the resulting PHI[n] as the phase output signal PHO[n] from the external terminal PN5[n]. Here, PN4[n] and PN5[n] of each POL[n] are coupled in a ring. That is, PN5[n] of POL[n] is sequentially coupled to PN4[n+1] of POL[n+1], and PN5[4] of POL [4] serving as an end point is fed back to PN4[1] of POL[1] serving as a starting point. Thus, PHI[1]-PHI[4] (and PHO [1]-PHO[4]) serve as signals having an identical frequency with phases different in units of 90°, respectively.

A feedback signal FB serving as the voltage signal of the output power source node VO is input to the external terminal PN14 of POL[1], and a common control signal SHR reflecting this FB is output from the external terminal PN15[1]. SHR from this POL[1] is input to POL[2]-POL[4] via the external terminals PN15[2]-PN15[4]. Each POL[n] operates with PHI[n] (or PHO[n]) as a starting point, and stores an electric power into the inductor L[n] via a switch signal SW[n] in the external terminal PN2[n]. Subsequently, each POL[n] continues to monitor SHR, and stops supplying the electric power to L[n] based on this result, thereby forming a path of reflux current in L[n].

Thus, a current with each phase different in units of 90° flows through each inductor L[n], and a part thereof is supplied to the load LOD coupled to the output power source node VO and other part is supplied to the capacitor Cld. LOD, with the voltage of VO as its power source voltage, performs a predetermined operation with a power source current supplied from each L[n] and Cld. Note that, each drive unit POL[n] is realized with a separate semiconductor package, for example, and is mounted in a vicinity of various types of circuit units (e.g., CPU, GPU, a memory, etc.) serving as the load LOD on a wiring board (PCB), such as a mother board or various types of extension boards (graphic board etc.). However, the present invention is not limited thereto, of course, and it is also possible, for example, to put together a plurality of drive units, such as mounting POL[1] and POL[2] onto one semiconductor package and mounting POL[3] and POL[4] onto another semiconductor package.

<<Detailed Configuration of the Main Part of the Whole Power Source Device>>

Figure 2:
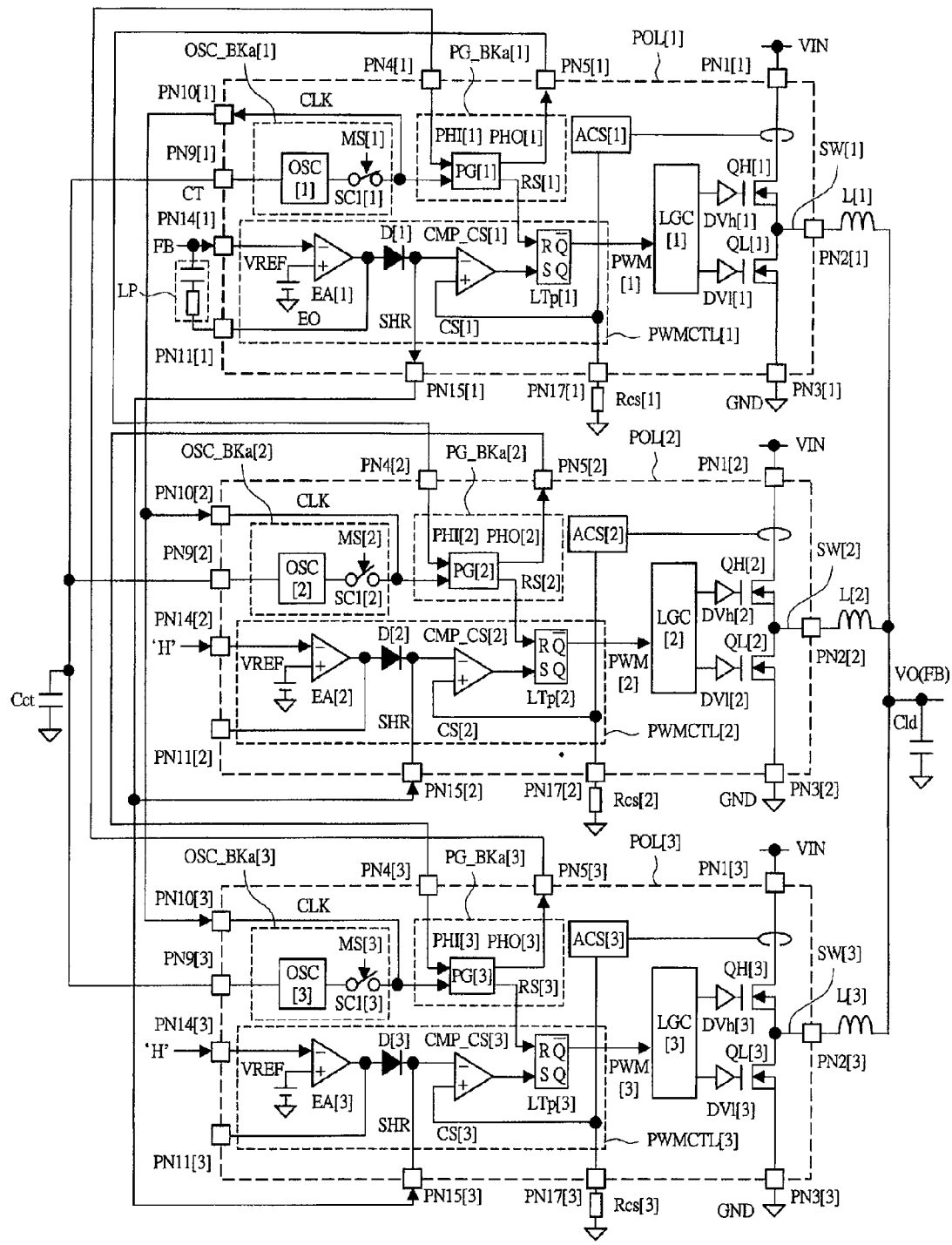
FIG. 2 is a circuit block diagram showing an example of the detailed configuration of a main part of the power source device of FIG. 1.

FIG. 2 is a circuit block diagram showing an example of the detailed configuration of the main part of the power source device of FIG. 1. FIG. 2 shows a configuration example using three drive units POL[1]-POL[3] and inductors L[1]-L[3], and the capacitors Cct, Cld. Since the connection configuration among POL[n] (n=1-3), L[n], and Cct, Cld is the same as that of FIG. 1, the detailed description thereof is omitted. However, here, because three pieces of POL[n] are used, the phase output signal PHO[3] from the external terminal PN5 [3] of POL[3] is fed back as the phase input signal PHI[1] from the external terminal PN4[1] of POL[1].

Each POL[n] includes four external terminals PN1[$n$], PN3[$n$], PN11[$n$], and PN17[$n$] in addition to seven external terminals PN2[$n$], PN4[$n$], PN5[$n$], PN9[$n$], PN10[$n$], PN14[$n$], and PN15[$n$] described in FIG. 1. For example, an input power source voltage VIN of 12 V etc. is supplied to PN1[$n$], and the ground power source voltage GND is supplied to PN3[$n$]. An external resistor Rcs[n] for current detection is coupled to PN17[$n$]. PN11[$n$] differs in the external connection configuration depending on whether the drive unit is used for the master (i.e., POL[1]) or for the slave (i.e., POL[2], POL[3]). A loop compensation circuit (low-pass filter circuit) LP is coupled between PN11[1] of POL[1] and the external terminal PN14[1] to which the feedback signal FB from the output power source node VO is input. On the other hand, nothing in particular is coupled to PN11[2], PN11[3] of POL [2], POL[3], while to PN14[2], PN14[3], an 'H' level signal is input, unlike PN14[1].

POL[1] includes an oscillator circuit block OSC_BKa[1], a phase signal generation circuit block PG_BKa[1], a PWM signal control circuit PWMCTL[1], an active-current detection circuit ACS[1], a control logic circuit LGC[1], driver circuits DVh[1], DVl[1], and transistors (power transistors) QH[1], QL[1]. QH[1] and QL[1] are a high side transistor and a low side transistor of the DC/DC converter, respectively, and here, an n channel MOSFET (power MOSFET) is used. In QH[1], the drain thereof is coupled to PN1[1] (VIN), the gate is coupled to the output node of DVh[1], and the source is coupled to the external terminal PN2[1] serving as the output terminal for the switch signal SW[1], respectively. In QL[1], the drain thereof is coupled to PN2[1] (SW[1]), the gate is coupled to the output node of DVl[1], and the source is coupled to the external terminal PN3[1] (GND), respectively. Here, the transistor coupled to a high-voltage power source side is defined as a high side transistor while the transistor coupled to a low-voltage power source side is defined as a low side transistor.

The oscillator circuit block OSC_BKa[1] includes an oscillator circuit OSC[1] and a switch SC1[1]. OSC[1], the detail of which will be described later, generates the clock control signal CT by charge and discharge of the capacitor Cct coupled to the external terminal PN9[1], and generates the clock signal CLK based on this CT. This CLK is output to the external terminal PN10[1] and the phase signal generation circuit block PG_BKa[1] via SC1[1]. PG_BKa[1] includes a phase signal generation circuit PG[1]. PG[1], the detail of which will be described later, delays the phase input signal PHI[1], which is input via the external terminal PN4[1], by one cycle of CLK, and outputs the resulting PH[1] as the phase output signal PHO[1] from the external terminal PN5 [1]. Moreover, PG[1] outputs a reset signal RS[1] having a phase identical to that of PHI[1] or PHO[1].

The active-current detection circuit ACS[1] detects a current flowing between the source and drain of QH[1], and outputs to the external terminal PN17[1] a current reflecting the magnitude of this current. This current is converted to a voltage by the resistor Rcs[1] coupled to PN17[1], and this voltage signal serves as the current detection signal CS[1]. The PWM signal control circuit PWMCTL[1] includes an error amplifier circuit EA[1], a diode D[1], a comparator circuit CMP_CS[1], and a latch circuit LTp[1].

The error amplifier circuit EA[1] receives the feedback signal FB from the external terminal PN14 [1] at the (−) input node, and amplifies this signal with reference to a reference voltage VREF applied to the (+) input node to output an error amplifier signal EO. This EO is output to the external terminal PN11[1], and is also stabilized by a loop compensation circuit LP coupled to PN11[1]. Moreover, in the diode D[1], the anode thereof is coupled to the output node of EA[1], and the cathode is coupled to the external terminal PN15[1] and the (−) input node of the comparator circuit CMP_CS[1]. Accordingly, EO is output to PN15[1] via D[1], and this signal serves as the common control signal SHR.

In the comparator circuit CMP_CS[1], SHR is applied to the (−) input node while the current detection signal CS[1] is applied to the (+) input node. Then, CMP_CS[1] outputs an 'H' level signal when the voltage level of CS[1] reaches the voltage level of SHR. The latch circuit LTp[1] is a set-reset type latch circuit, wherein the reset signal RS[1] from the phase signal generation circuit PG[1] is input to the reset (R) node, and the output signal from CMP_CS[1] is input to the set (S) node. Then, LTp[1] outputs a PWM signal PWM[1] from a negative polarity output node (/Q). The control logic circuit LGC[1] drives QH[1] via a driver circuit DVh using this PWM[1], and drives QL[1] via a driver circuit DVl using the complementary signal of PWM[1].

POL[2] and POL[3] also have the same internal circuit configuration as that of POL[1] described above. Note that, in FIG. 2, the various types of internal circuits described above for each POL[n] (n=1-3) are distinguished with the value of [n]. However, POL[2] and POL[3] differ from POL[1] in terms of operation, due to the differences in various kinds of control signals.

As the first difference, first of all, in the oscillator circuit block OSC_BKa[1] of POL[1], the switch SC1[1] is turned on/off in response to a master/slave control signal MS[1]. Here, MS[1] is driven to a voltage level indicative of master and accordingly SC1[1] is turned on. On the other hand, in the oscillator circuit blocks OSC_BKa[2], OSC_BKa[3] of POL [2], POL[3], master/slave control signals MS[2], MS[3] are driven to a voltage level indicative of slave and accordingly SC1[2], SC1[3] are turned off. Thus, CLK generated from OSC_BKa[1] of POL[1] can be used commonly in the phase signal generation circuit blocks PG_BKa[1]-PG_BKa[3] of POL[1]-POL[3].

As the second difference, first of all, in the PWM signal control circuit PWMCTL[1] of POL[1], the common control signal SHR is output from the external terminal PN15[1] based on the feedback signal FB input from the external terminal PN14[1]. On the other hand, in the PWM signal control circuits PWMCTL[2], PWMCTL[3] of POL[2], POL[3], the outputs of the error amplifier circuits EA[2], EA[3] are fixed to an 'L' level because an 'H' level is input to the external terminals PN14[2], PN14[3]. Accordingly, in PWMCTL[2] and PWMCTL[3], the output nodes of EA[2], EA[3] and the external terminals PN15[2], PN15[3] are separated by the diodes D[2], D[3], respectively. Thus, SHR output from PN15[1] of POL[1] can be used commonly in the comparator circuits CMP_CS[1]-CMP_CS[3] of POL[1]-POL[3].

The clock signal CLK and common control signal SHR are shared by each POL[n] in this manner, and thus a stable multi-phase operation can be achieved. Note that, as described above, since the diodes D[2], D[3] function as a conduction control circuit, these also may be replaced with switches which are turned on/off by the master/slave control signals MS[2], MS[3].

<<Details of the Oscillator Circuit Block>>

Figure 3:
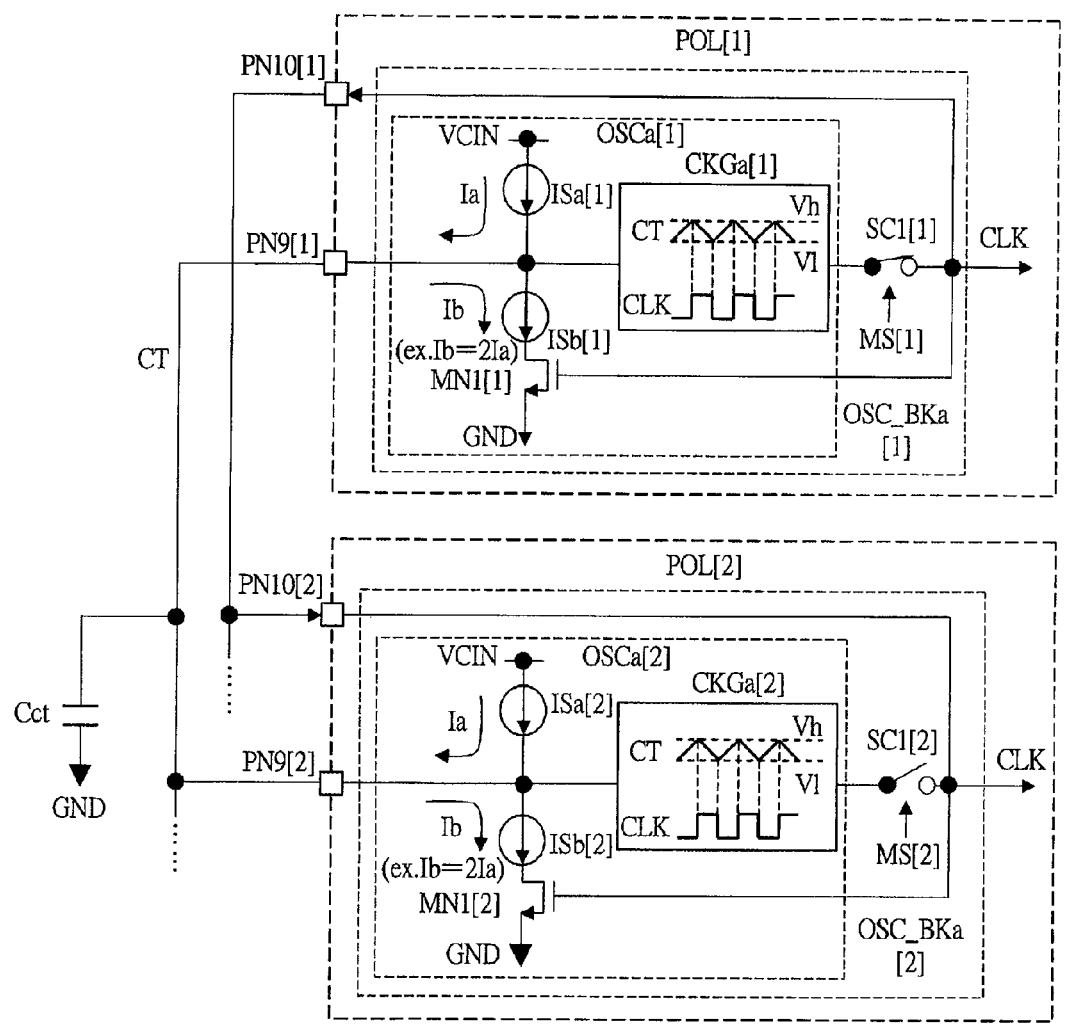
FIG. 3 is a circuit block diagram showing an example of the detailed configuration of an oscillator circuit block in the power source device of FIG. 2.

FIG. 3 is a circuit block diagram showing an example of the detailed configuration of the oscillation circuit block OSC_BKa in the power source device of FIG. 2. FIG. 3 shows an example of the configuration of the oscillator circuit blocks OSC_BKa[1] and OSC_BKa[2] included in the drive units POL[1], POL[2], respectively. OSC_BKa[1] includes an oscillator circuit OSCa[1] and the switch SC1[1], wherein OSCa[1] includes constant current circuits ISa[1], ISb[1], an n-channel MOS transistor MN1[1], and a clock signal generation circuit CKGa[1].

ISa[1] causes a constant current Ia to flow from a power source voltage VCIN toward the external terminal PN9[1]. MN1[1] and ISb[1] are inserted in series between PN9[1] and the ground power source voltage GND, and cause a constant current Ib (>Ia) to flow from PN9[1] toward GND when MN1[1] is turned on. Therefore, when MN1[1] is off, a charge current Ia flows toward the capacitor Cct at PN9[1], while when MN1[1] is on, a discharge current (Ib-Ia) from the capacitor Cct flows at PN9[1]. When the voltage level of the clock control signal CT in PN9[1] exceeds a high-potential side threshold voltage Vh, CKGa[1] causes the clock signal CLK to transition to an 'H' level, while when it falls below a low-potential side threshold voltage CKGa[1] causes CLK to transition to an 'L' level. This CLK is output to the external terminal PN10[1] via the switch SC1[1] which is kept being turned on, and is also input to the gate of MN1[1].

Similarly, OSC_BKa[2] includes an oscillator circuit OSCa[2] and the switch SC1[2], and the OSCa[2] includes constant current circuits ISa[2], ISb[2], an n-channel MOS transistor MN1[2], and a clock signal generation circuit CKGa[2]. Their configurations are the same as those of the case of OSC_BKa[1] described above. However, in OSC_BKa[2], because the switch circuit SC1[2] is kept being turned off, the gate of MN1[2] will be driven by the clock signal CLK input via the external terminal PN10[2] from the external terminal PN10[1]. Moreover, because SC1[2] is kept being turned off, CKGa[2] is substantially equivalent to the case where it does not exist.

If the configuration example as shown in FIG. 3 is used, then, first of all, when CLK is at an 'L' level, MN1[1] and MN1[2] are turned off and the capacitor Cct is charged by a charge current (=2×Ia) in PN9[1], PN9[2]. Then, when the voltage level of the clock control signal CT exceeds Vh associated with this charging, CLK will transition to an 'H' level by CKGa[1]. When CLK transitions to an 'H' level, MN1[1] and MN1[2] are turned on and the capacitor Cct is discharged by a discharge current (=2×(Ib-Ia)) in PN9[1], PN9[2]. Then, when the voltage level of CT falls below Vl associated with this discharging, CLK transitions to an 'L' level by CKGa[1] and subsequently the same operation will be repeated.

Therefore, if two oscillator circuit blocks (OSC_BKa[1], OSC_BKa[2]) are coupled to the capacitor Cct as shown in FIG. 3 and Ib is set to Ib=2×Ia, for example, then the charge current and the discharge current become 2×Ia, respectively, and therefore the frequency (Fclk(2)) of the clock signal CLK is given by Formula (1) below. Furthermore, similarly, when n oscillator circuit blocks are coupled to Cct, the charge current and discharge current become n×Ia, respectively and therefore the frequency (Fclk(n)) of CLK is given by Formula (2) below. In this manner, if the configuration example of FIG. 3 is used, the frequency of CLK increases n times in proportion to an increase in the number of phases n of multi-phase.

$$F\text{clk}(2)=1/(2\times Cct\times(Vh-Vl)/(2\times Ia)) \quad (1)$$

$$F\text{clk}(n)=1/(2\times Cct\times(Vh-Vl)/(n\times Ia)) \quad (2)$$

Figure 4:
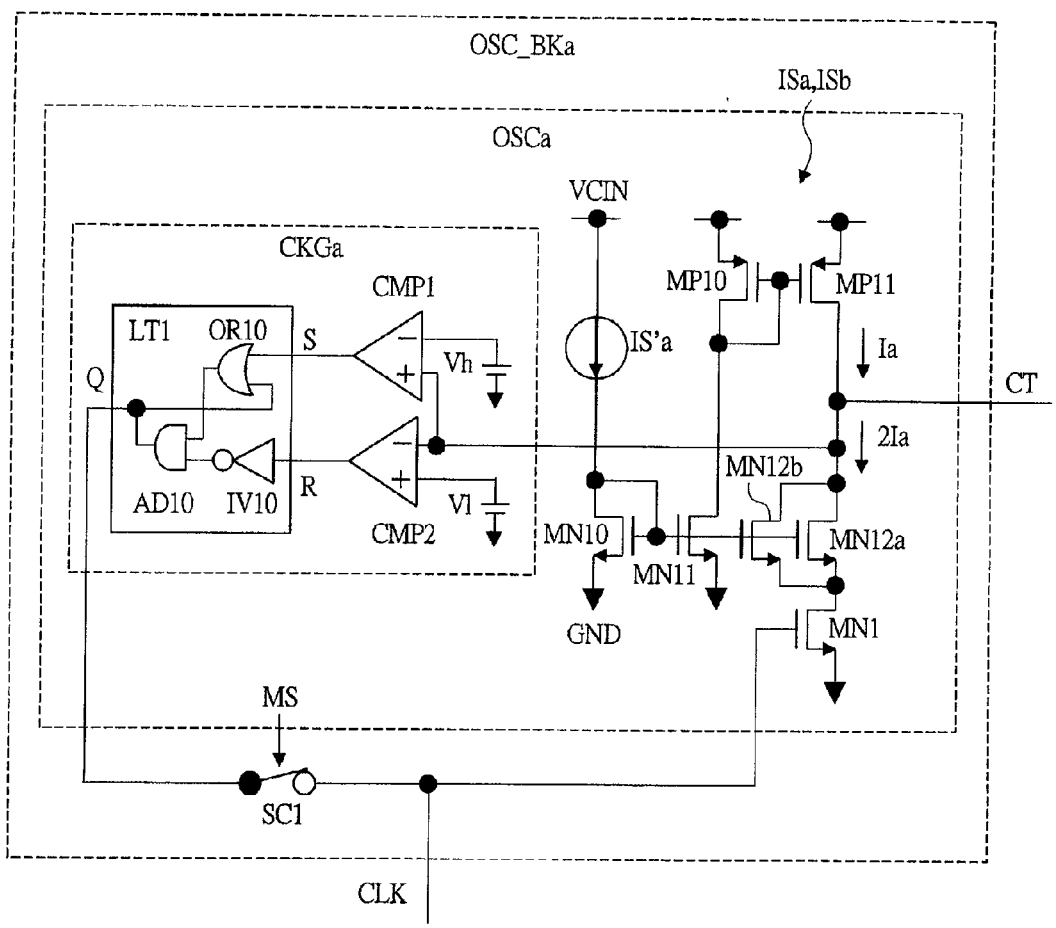
FIG. 4 is a circuit diagram showing an example of the further detailed configuration of the oscillator circuit block of FIG. 3.

FIG. 4 is a circuit diagram showing an example of the further detailed configuration of the oscillation circuit block OSC_BKa of FIG. 3. As shown in FIG. 4, the constant current circuit ISa, ISb in FIG. 3 includes a constant current source IS'a, a plurality of n-channel MOS transistors MN10, MN11, MN12a, and MN12b, and a plurality of PMOS transistors MP10, MP11. Here, assume that all of MN10, MN11, MN12a, and MN12b have an identical transistor size and MP10 and MP11 also have an identical transistor size.

IS'a, one end of which is coupled to the power source voltage VCIN, outputs the current Ia. In MN10, the source thereof is coupled to the ground power source voltage GND, and the gate and the drain are commonly coupled to the other end of IS'a. In MN11, the source thereof is coupled to the ground power source voltage GND, and the gate is coupled to the gate of MN10. In MP10, the source thereof is coupled to VCIN and the gate and the drain are commonly coupled to the drain of MN11. In MP11, the source thereof is coupled to VCIN and the gate is coupled to the gate of MP10. In MN12a and MN12b, both of the sources thereof are coupled to the drain of the n-channel MOS transistor MN1 described in FIG. 3, the gate is coupled to the gate of MN10, and the drain is coupled to the drain of MP11. Then, the clock control signal CT is generated at the drains of these MP11, MN12a, and MN12b.

In FIG. 4, the current Ia from IS'a is transferred to MN11 via a current mirror circuit composed of MN10 and MN11, and is transferred to MP11 via a current mirror circuit composed of MP10 and MP11. Moreover, when MN1 is turned on, Ia from IS'a is transferred as 2×Ia to MN12a, MN12b via a current mirror circuit composed of MN10, MN12a and MN12b. Therefore, as the current of the clock control signal CT, the discharge current of Ia flows when MN1 is turned on, while when MN1 is turned off, the charge current of Ia flows.

Moreover, as shown in FIG. 4, the clock signal generation circuit CKGa in FIG. 3 includes a latch circuit LT1 and comparator circuits CMP1, CMP2. CMP1 outputs an 'H' level signal when the voltage level of the clock control signal CT exceeds the high-potential side threshold voltage Vh. CMP2 outputs an 'H' level signal when the voltage level of the clock control signal CT falls below the low-potential side threshold voltage Vl. That is, when the voltage level of CT is higher than Vh, an 'H' level signal is output from CMP1 and an 'L' level signal is output from CMP2, while when the voltage level of CT is higher than Vl and lower than Vh, an 'L' level signal is output from both CMP1 and CMP2, and when the voltage level of CT is lower than Vl, an 'L' level signal is output from CMP1 and an 'H' level signal is output from CMP2.

LT1 includes an AND operation circuit AD10, an OR operation circuit OR10, and an inverter circuit IV10. In AD10, the output signal of CMP2 is input to one of two inputs via IV10, and the output of OR10 is input to the other input. In OR10, the output of CMP1 is input to one of two inputs, and the output of AD10 is fed back to the other input. With such a configuration, LT1 operates as a set-reset type latch circuit with the output of CMP1 as a set (S) input and the output of CMP2 as a reset (R) input and the output of AD10 as a positive polarity output node (Q). Therefore, LT1 outputs an 'H' level signal upon receipt of the set input when the voltage level of the clock control signal CT exceeds Vh associated with the charge current. Then, the charge current at CT switches to the discharge current. LT1 causes the output thereof to transition from an 'H' level signal to an 'L' level signal upon receipt of the reset input when the voltage level of CT falls below Vl. Subsequently, the discharge current at CT switches to the charge current again, and the same operation will be repeated.

<<Details of the Phase Signal Generation Circuit>>

Figure 5A:
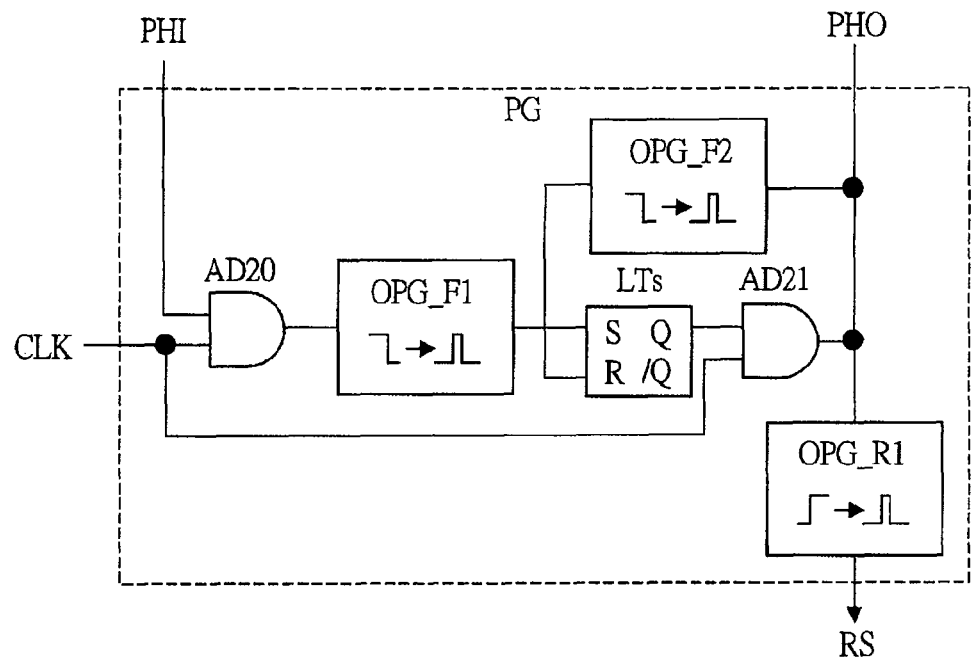
FIG. 5A shows the detail of a phase signal generation circuit in the power source device of FIG. 2, and is a circuit block diagram showing an example of the configuration.
Figure 5B:
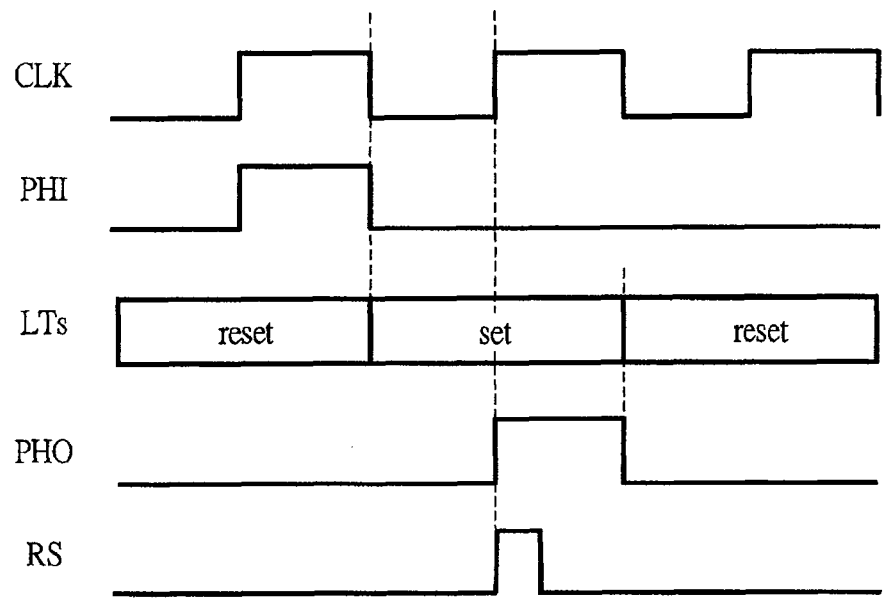
FIG. 5B is a waveform chart showing an operation example of FIG. 5A.

FIG. 5A shows the detail of the phase signal generation circuit PG in the power source device of FIG. 2, and is a circuit block diagram showing an example of the configuration. FIG. 5B is a waveform chart showing an operation example of FIG. 5A. The phase signal generation circuit PG shown in FIG. 5A includes AND operation circuits AD20, AD21, one-shot pulse generation circuits OPG_F1, OPG_F2 and OPG_R1, and a latch circuit LTs.

AD20 receives the phase input signal PHI and the clock signal CLK, and outputs the result of the AND operation. Upon detection of a falling edge at the output of AD20, OPG_F1 outputs a one-shot pulse signal. LTs is a set-reset type latch circuit, wherein the output from OPG_F1 is input to the set (S) node and the output from OPG_F2 is input to the reset (R) node. AD21 receives CLK and the signal from the positive polarity output node (Q) of LTs, and outputs the result of the AND operation as the phase output signal PHO. Upon detection of a falling edge at PHO, OPG_F2 outputs a one-shot pulse signal. Upon detection of a rising edge at PHO, OPG_R1 outputs a reset signal RS serving as one-shot pulse signal.

If such a configuration example is used, then as shown in FIG. 5B, the phase output signal PHO, which is a signal obtained by delaying the input phase input signal PHI by one cycle of the clock signal CLK, can be generated. Moreover, the reset signal RS can be generated in response to this PHO. Note that, of course, the phase signal generation circuit PG is not limited to such a configuration example, and can be adequately modified to any circuit which generates PHO by delaying PHI by one cycle of CLK. Moreover, this delay amount is also not necessarily limited to one cycle, and may be set to two cycles etc. depending on circumstances. Furthermore, RS does not necessarily need to correspond to PHO, but may correspond to PHI, for example.

<<Detailed Operation of the Main Part of the Whole Power Source Device>>

Figure 6:
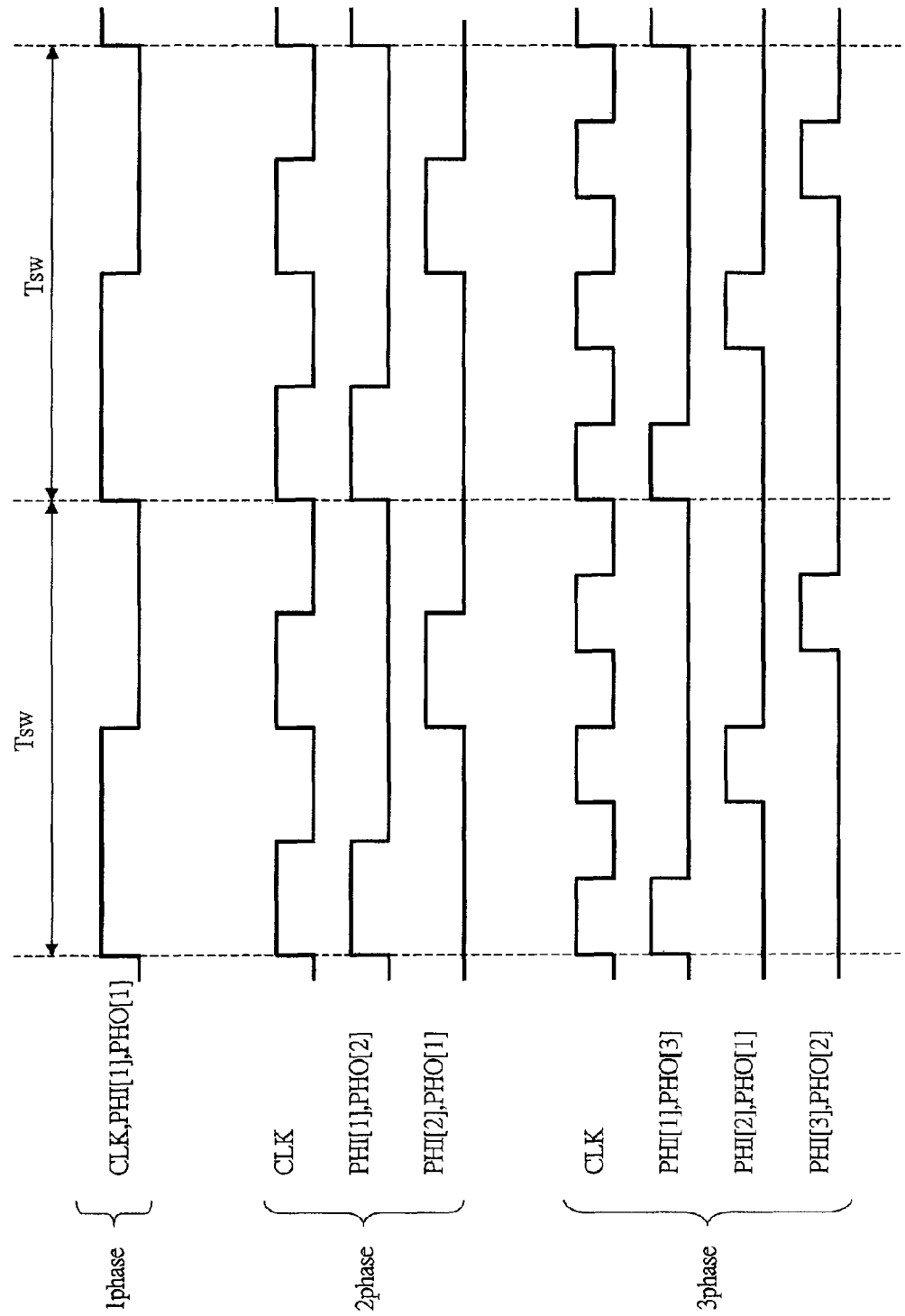
FIG. 6 is a waveform chart showing an example of the operation of a clock signal, a phase input signal, and a phase output signal when the number of phases is changed in the power source device of FIG. 2.

FIG. 6 is a waveform chart showing an example of the operation of the clock signal CLK, the phase input signal PHI, and the phase output signal PHO when the number of phases is changed in the power source device of FIG. 2. As shown in FIG. 6, first, when only one drive unit POL[1] is coupled to the capacitor Cct of FIG. 2, a one-phase operation with one cycle of CLK as a switching cycle Tsw is performed. Next, when two drive units POL[1] and POL[2] are coupled to the capacitor Cct, a two-phase operation with two cycles of CLK as Tsw is performed. However, as described in FIG. 3, in this case, the frequency Fsw of CLK doubles as compared with the case of the one-phase operation, so Tsw is equal to that of the case of the one-phase operation. Furthermore, when three drive units POL[1]-POL[3] are coupled to the capacitor Cct, a three-phase operation with three cycles of CLK as Tsw is performed. Also in this case, Fsw of CLK triples as compared with that of the case of the one-phase operation, so Tsw is equal to that of the cases of the one-phase operation and two-phase operation.

Figure 7:
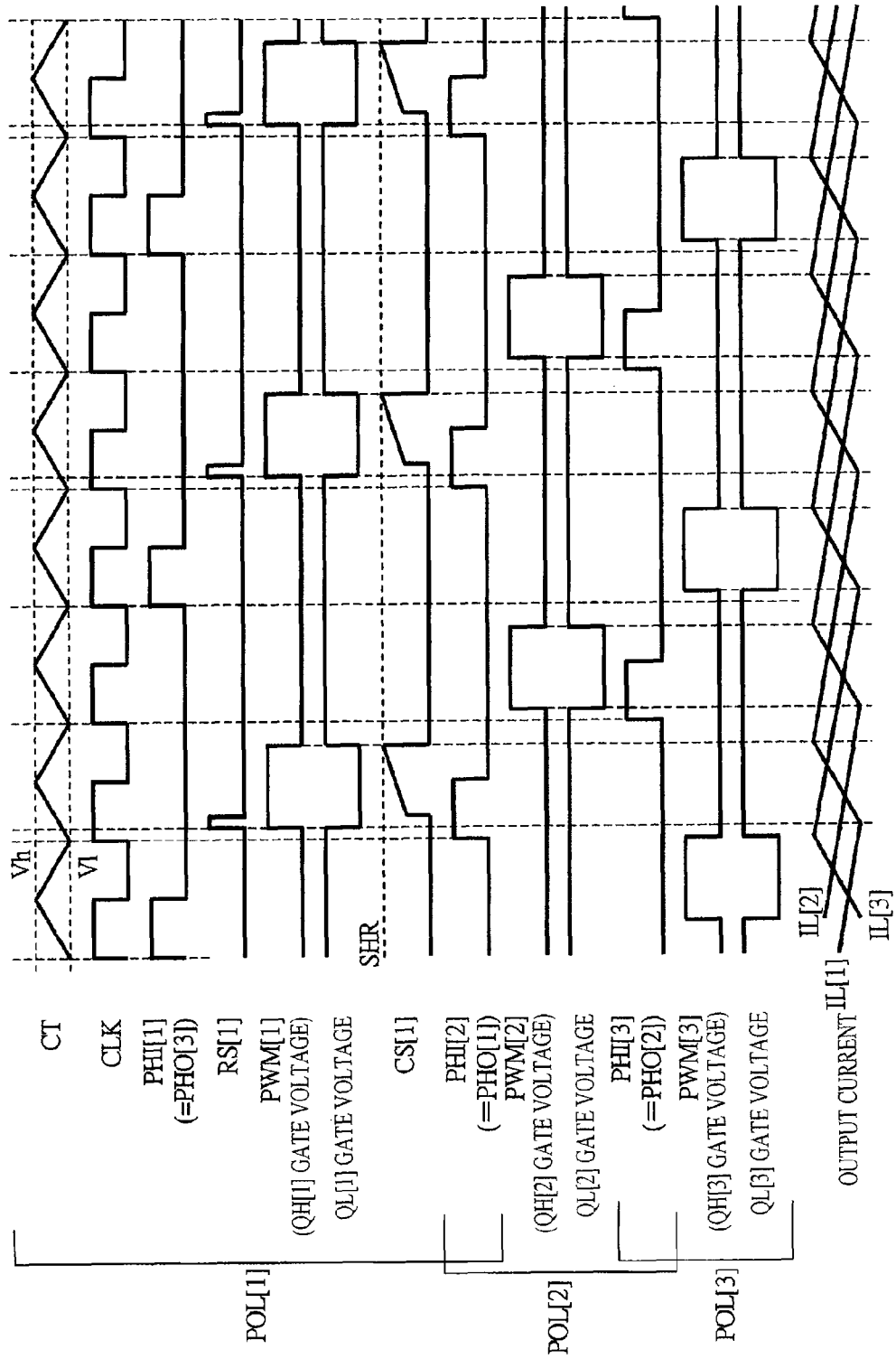
FIG. 7 is a waveform chart showing an example of the detailed operation of each drive unit during a three-phase operation in the power source device of FIG. 2.

FIG. 7 is a waveform chart showing an example of the detailed operation of the respective drive units POL[1]-POL[3] during the three-phase operation in the power source device of FIG. 2. As shown in FIG. 7, first of all, in POL[1], the clock signal CLK is generated in response to the clock control signal CT. Here, upon receipt of the phase input signal PHI[1] in synchronization with any one of the CLK cycles, the phase signal generation circuit PG[1] outputs the phase output signal PHO[1] in synchronization with the next CLK cycle and also outputs the reset signal RS[1] after a predetermined delay period from this time point. The latch circuit LTp[1], in response to this RS[1], drives the PWM signal PWM[1] from an 'L' level to an 'H' level, and accordingly the transistor QH[1] is turned on and QL[1] is turned off.

When QH[1] is turned on, the current IL[1] flowing through the inductor L[1] will gradually increase. Moreover, when QH[1] is turned on and after a predetermined blanking period, the voltage level of the current detection signal CS[1] serving as a signal, which reflects this IL[1] via the active-current detection circuit ACS[1] etc., will rise. On the other hand, the error amplifier circuit EA[1] generates the common control signal SHR by amplifying the voltage level of the output power source node VO with reference to the predetermined voltage (VREF). Here, when the peak voltage of CS[1] reaches the voltage level of SHR, a pulse signal is generated by the comparator circuit CMP_CS[1]. In response to this, the latch circuit LTp[1] drives the PWM signal PWM[1] from an 'H' level to an 'L' level, and accordingly the transistor QH[1] is turned off and QL[1] is turned on. Then, IL[1] gradually decreases while re-circulating via QL[1]. Subsequently, again, when PHI[1] is input, the same operation will be repeated. The method for controlling the peak of IL[1] (CS [1]) so as to be a predetermined value (SHR) in this manner is called a peak current control method or the like.

Moreover, POL[2], as with POL[1], outputs the phase output signal PHO[2] with the phase output signal PHO[1] output from POL[1] as the phase input signal PHI[2] and also controls, as with POL[1], the current of the inductor L[2]. In this case, the clock signal CLK or the common control signal SHR is commonly supplied from POL[1]. Furthermore, POL [3], as with POL[1], outputs the phase output signal PHO[3] with the phase output signal PHO[2] output from POL[2] as the phase input signal PHI[3] and also controls, as with POL [1], the current of the inductor L[3]. In this case, CLK and SHR are commonly supplied from POL[1]. Then, this PHO [3] is fed back as PHI[1] to POL[1] so that the three-phase switching operation is repeated.

<<Description of Main Effects>>

As described above, by use of the power source device of Embodiment 1, representatively, a multi-phase power source device capable of easily changing the number of phases can be realized. That is, by coupling the drive units POL corresponding to the number of phases to the capacitor Cct, the switching frequency can be automatically adjusted so as to be an identical switching frequency regardless of the number of phases n, and by coupling the respective POL's in a loop, the phase difference between the respective phases is automatically adjusted to a predetermined value (=360°/n). Moreover, because the control unit is not required as described above, a reduction in the size of the power source device can be also achieved. Furthermore, each POL is operated with a peak current control method, so that a switching operation synchronized with the clock signal CLK (phase input signal PHI or phase output signal PHO) can be easily realized and it is also possible to control so as to supply an equal current for each phase. As a result, the multi-phase operation can be also stabilized. However, the method does not necessarily need to be the peak current control method, and a similar effect can be obtained by any current-mode control method, including an average current control method or the like.

Embodiment 2

<<Detailed Configuration and Operation of the Main Part of the Whole Power Source Device>>

Figure 8:
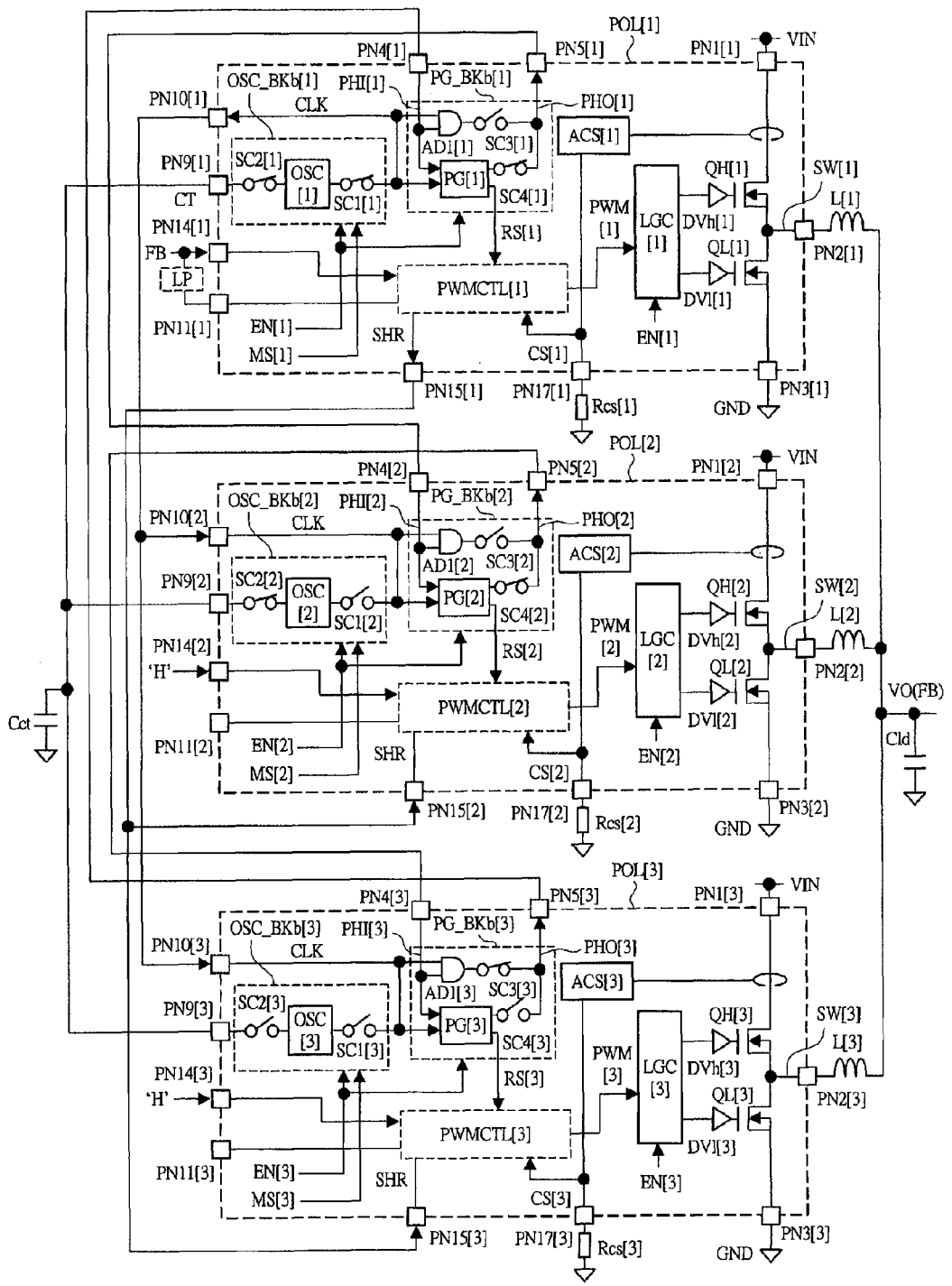
FIG. 8 is a circuit block diagram showing an example of the detailed configuration of a main part in a power source device according to Embodiment 2 of the present invention.

In Embodiment 2, a configuration example is described in which additional functions are added to the power source device described in FIG. 2 of Embodiment 1. FIG. 8 is a circuit block diagram showing an example of the detailed configuration of the main part in the power source device according to Embodiment 2 of the present invention. The power source device shown in FIG. 8 differs from the power source device of FIG. 2 in terms of the internal configuration of the oscillator circuit blocks OSC_BKb[1]-OSC_BKb[3] and phase signal generation circuit blocks PG_BKb[1]-PG_BKb[3] in each of the drive units POL[1]-POL[3]. Furthermore, each of enable signals EN[1]-EN[3] is input to each of the control logic circuits LGC[1]-LGC[3] in each of POL[1]-POL[3]. The detailed description of the other configuration is omitted because it is the same as that of the power source device of FIG. 2. When EN[n] is in an inactive state, each LGC[n] fixes the transistors QH[n], QL[n] to an off-state to stop the switching operation.

An oscillator circuit block OSC_BKb[1] in POL[1] includes a switch SC2[1] in addition to the same oscillator circuit OSC[1] and switch SC1[1] as those of the oscillator circuit block OSC_BKa[1] of FIG. 2. As with the case of FIG. 2, when the master/slave control signal MS[1] is at a voltage level of the master side, SC1[1] is turned on to transmit the clock signal CLK from OSC[1] to the external terminal PN10[1] and the like. SC2[1] is turned on when the enable signal EN[1] is in an active state. EN[1] is activated when the operation of POL[1] is enabled (that is, when the corresponding phase is enabled), while when the operation of POL[1] is disabled (that is, when the corresponding phase is disabled), EN[1] is deactivated. Because POL[1] is the master device, EN[1] is activated and SC2[1] is turned on. SC2[1], when turned on, couples OSC[1] to the external terminal PN9[1] (i.e., capacitor Cct).

The oscillator circuit block OSC_BKb[2] in POL[2], as with OSC_BKb[1], includes the oscillator circuit OSC[2] and the switches SC1[2], SC2[2]. SC1[2] is turned off when the master/slave control signal MS[2] is at a voltage level of the slave side. Moreover, in the example of FIG. 8, the enable signal EN[2] is activated and accordingly SC2[2] is turned on. The oscillator circuit block OSC_BKb[3] in POL[3], as with OSC_BKb[1], includes the oscillator circuit OSC[3] and the switches SC1[3], SC2[3]. SC1[3] is turned off when the master/slave control signal MS[3] is at a voltage level of the slave side. Moreover, in the example of FIG. 8, the enable signal EN[3] is deactivated and accordingly SC2[3] is turned off.

That is, the power source device of FIG. 8 shows an example, wherein the operation of one (here, POL[3]) of the three drive units POL[1]-POL[3] is set to a disabled state (that is, the corresponding phase is disabled), so that the two-phase operation is realized. Here, because the switch SC2[3] is turned off, the oscillator circuit OSC[3] is not coupled to the capacitor Cct but the oscillator circuits OSC[1], OSC[2] are coupled to Cct. Accordingly, the frequency of the clock signal CLK output from OSC[1], as shown in the case of the two-phase operation of FIG. 6, is twice that in the case of one-phase operation (i.e., when only OSC[1] is coupled to Cct).

Moreover, in the power source device of FIG. 8, the phase signal generation circuit block PG_BKb[1] in POL[1] includes an AND operation circuit AD1[1] and switches SC3[1], SC4[1] in addition to the same phase signal generation circuit PG[1] as that of the power source device of FIG. 2. In AD1[1], the clock signal CLK transmitted on the external terminal PN10[1] is input to one of two inputs, and the phase input signal PHI[1] from the external terminal PN4[1] is input to the other input. Then, AD1[1] outputs the result of the AND operation. SC3[1], when turned on, transmits the output signal from AD1[1] to the external terminal PN5[1] as the phase output signal PHO[1]. SC4[1], when turned on, transmits the phase output signal PHO[1] from PG[1] to PN5[1].

SC3[1] and SC4[1] are exclusively turned on and off in response to the state of the enable signal EN[1]. When EN[1] is in an active state, the SC4[1] side is turned on and PHO[1] from PG[1] is transmitted to PN5[1]. On the other hand, when EN[1] is in an inactive state, the SC3[1] side is turned on and PHI[1] from PN4[1] is transmitted to PN5[1] via AD1[1]. That is, when EN[1] is in an active state, PHO[1] which is PHI[1] delayed by a predetermined cycles of CLK is output from PN5[1], and when EN[1] is in an inactive state, PHI[1] is output as PHO[1], as it is, from PN5[1]. In the example of FIG. 8, the SC4[1] side is turned on because EN[1] is in an active state. Note that, AD1[1] is for synchronizing PHI[1] with CLK (that is, for finely adjusting the timing) and may be omitted depending on circumstances.

The phase signal generation circuit block PG_BKb[2] in POL[2] includes, as with PG_BKb[1], a phase signal generation circuit PG[2], an AND operation circuit AD1[2] and switches SC3[2], SC4[2]. In the example of FIG. 8, the SC4[2] side is turned on because the enable signal EN[2] is in an active state. The phase signal generation circuit block PG_BKb[3] in POL[3] includes, as with PG_BKb[1], a phase signal generation circuit PG[3], an AND operation circuit AD1[3] and switches SC3[3], SC4[3]. In the example of FIG. 8, the SC3[3] side is turned on because the enable signal EN[3] is in an inactive state.

If such a configuration example is used, the phase output signal PHO[2] output from the external terminal PN5[2] of POL[2] is fed back, as it is, to the external terminal PN4[1] of POL[1] via the external terminal PN4[3], switch SC3[3], and external terminal PN5[3] of POL[3]. Thus, as shown in the case of the two-phase operation of FIG. 6, the two-phase operation using phase differences (180°) at equal intervals can be realized by POL[1] and POL[2].

<<Details of the Oscillator Circuit Block>>

Figure 9:
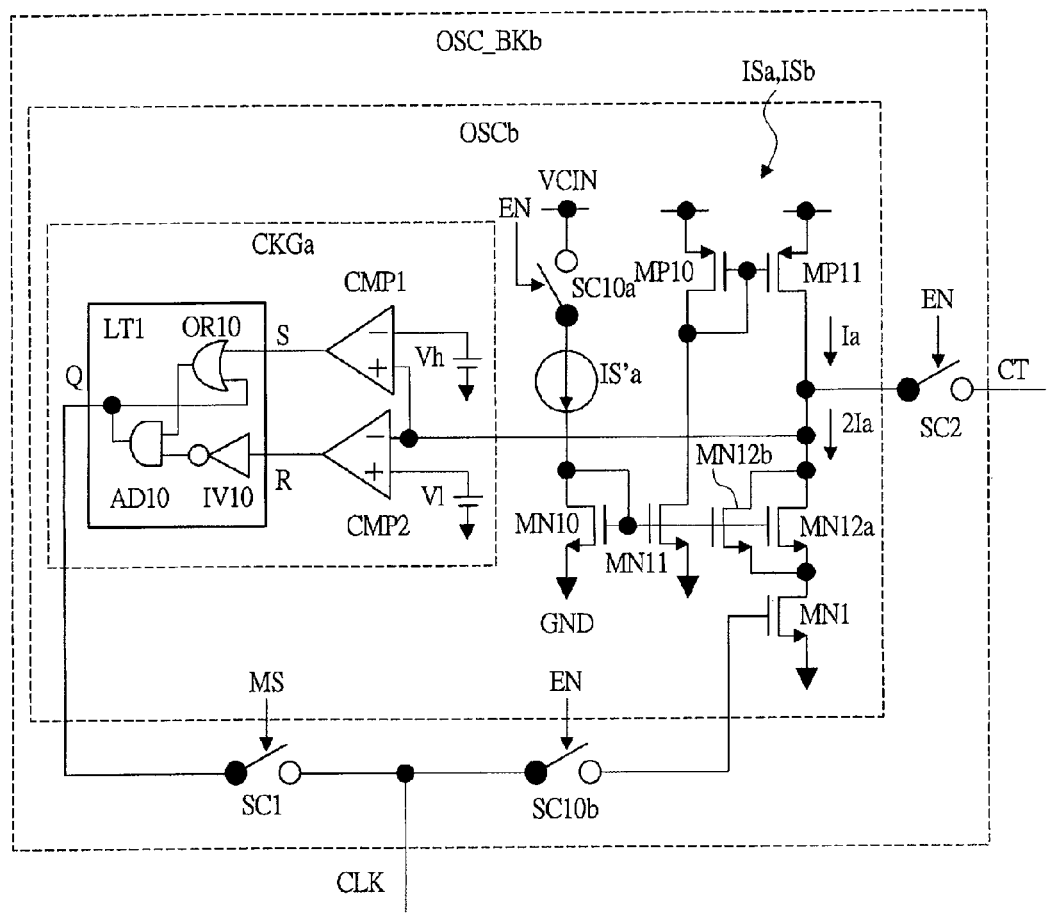
FIG. 9 is a circuit diagram showing an example of the detailed configuration of an oscillator circuit block in the power source device of FIG. 8.

FIG. 9 is a circuit diagram showing an example of the detailed configuration of the oscillator circuit block OSC_BKb in the power source device of FIG. 8. OSC_BKb shown in FIG. 9 includes switches SC2, SC10a, and SC10b added as compared with the oscillator circuit block OSC_BKa of FIG. 4. The detailed description of the other configuration is omitted because it is the same as that of OSC_BKa of FIG. 4.

As described in FIG. 8, SC2, when turned on, couples the constant current circuits ISa, ISb to the clock control signal CT (capacitor Cct). SC10a is provided between the power source voltage VCIN and the constant current source IS'a, while SC10b, when turned on, couples the clock signal CLK to the gate of the n-channel MOS transistor MN1. SC10a and SC10b, together with SC2 described above, are turned on when the enable signal EN is in an active state, while when the enable signal EN is in an inactive state, these are turned off. Therefore, when EN is in an inactive state, the connection between ISa, ISb and CT (capacitor Cct) is cut off upon turning off of SC2 while the generation of constant currents in ISa, ISb stops upon turning off of SC10a, SC10b. Thus, a reduction in the power consumption can be achieved in a drive unit whose operation is disabled. Note that, when SC10a and SC10b are turned off, the drain node of the P-channel type MOS transistor MP11 and n-channel MOS transistors MN12a, MN12b usually goes to a high impedance state. Because this is equivalent to the case where SC2 is turned off, SC2 may be omitted depending on circumstances and the function of SC2 may be included in SC10a, SC10b.

<<Description of Main Effects>>

As described above, by use of the power source device of Embodiment 2, representatively, a multi-phase power source device capable of easily changing the number of phases can be realized, as with the case of Embodiment 1. Moreover, a reduction in the size of the power source device, the stabilization of the multi-phase operation, and the like can be achieved. Furthermore, in addition to the effects of Embodiment 1, a dynamic change of the number of phases of the multi-phase operation also can be easily realized. That is, in FIG. 8, for example, if all the enable signals EN[1], EN[2], and EN[3] are activated, the three-phase operation can be realized, and if only EN[3] is changed from this state to an inactive state, the two-phase operation can be realized, and further if EN[2] is also changed from this state to an inactive state, the one-phase operation can be realized. Therefore, the optimum number of phases in response to the consumption current of a load can be dynamically selected, and an improvement in the power conversion efficiency and the like can be achieved.

Embodiment 3

<<Detailed Configuration of the Main Part of the Whole Power Source Device>>

Figure 10:
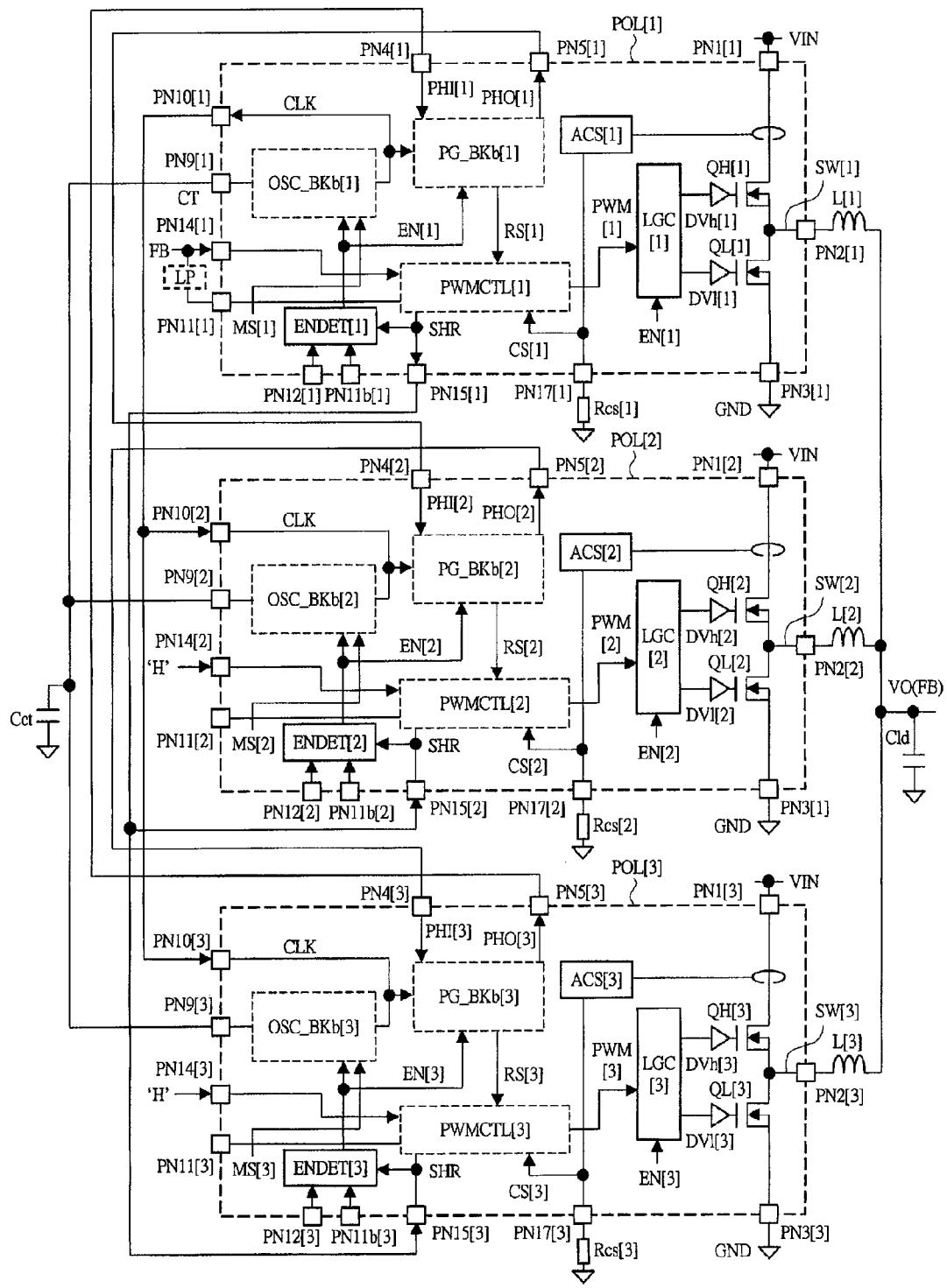
FIG. 10 is a circuit block diagram showing an example of the detailed configuration of a main part in a power source device according to Embodiment 3 of the present invention.

In Embodiment 3, a configuration example is described in which additional functions are added to the power source device described in FIG. 8 of Embodiment 2. FIG. 10 is a circuit block diagram showing an example of the detailed configuration of a main part in a power source device according to Embodiment 3 of the present invention. The power source device shown in FIG. 10 includes external terminals PN11b[n], PN12[n], and an enable detection circuit ENDET[n] added to each drive unit POL[n] (n=1-3), as compared with the power source device of FIG. 8. The detailed description of the other configuration is omitted because it is the same as that of the power source device of FIG. 8.

<<Details of the Enable Detection Circuit>>

Figure 11:
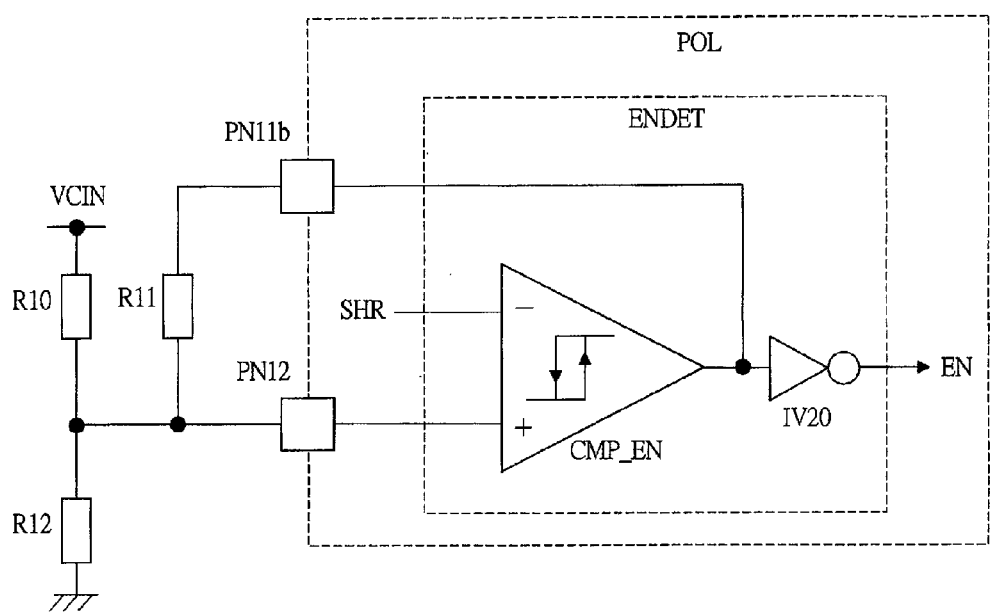
FIG. 11 is a circuit diagram showing an example of the detailed configuration of an enable detection circuit in the power source device of FIG. 10.

FIG. 11 is a circuit diagram showing an example of the detailed configuration of the enable detection circuit ENDET in the power source device of FIG. 10. The enable detection circuit ENDET shown in FIG. 11 includes a comparator circuit CMP_EN receiving the common control signal SHR at the (−) input and receiving the signal from the external terminal PN12 at the (+) input, and an inverter circuit IV20 which outputs the inverted signal of the output of CMP_EN as the enable signal EN. The output of CMP_EN is output to the outside via the external terminal PN11b, and is fed back and input to PN12 via an external resistor R11. Moreover, an external resistor R10 is connected between PN12 and the power source voltage VCIN, and an external resistor R12 is connected between PN12 and the ground power source voltage GND.

If such a configuration example is used, then when the output of CMP_EN is at an 'H' level (VCIN level), the voltage level of PN12 is determined by the resistance voltage division by the parallel resistance of R10 and R11 and the resistance of R12, while when the output of CMP_EN is at an 'L' level (GND level), the voltage level of PN12 is determined by the resistance voltage division by the resistance of R10 and the parallel resistance of R12 and R11. That is, CMP_EN functions as a hysteresis comparator. When the voltage level of SHR is low (i.e., when the output of CMP_EN is at an 'H' level) and subsequently the voltage level of SHR rises and exceeds a relatively high threshold voltage, the output of CMP_EN transitions to an 'L' level (EN transitions to an 'H' level (active state)). Moreover, when the voltage level of SHR is high (i.e., when the output of CMP_EN is at an 'L' level) and subsequently the voltage level of SHR decreases and falls below a relatively low threshold voltage, the output of CMP_EN transitions to an 'H' level (EN transitions to an 'L' level (inactive state)).

On the other hand, the common control signal SHR is a signal for determining the peak current of the current flowing through the transistor QH (in other words, the current flowing through the inductor L) as described in FIG. 7. In POL[1], the loop control is performed so that the average value of the current flowing through the inductor L becomes equal to the consumption current of the load LOD, and therefore the higher the consumption current of LOD, the higher the voltage level of SHR becomes, while the lower the consumption current of LOD, the lower the voltage level of SHR becomes. That is, the consumption current of LOD can be determined by the voltage level of SHR, and therefore if this voltage level of SHR is monitored and the number of phases is automatically switched, an improvement in the power conversion efficiency and the like can be achieved.

Then, when the voltage level of SHR is monitored by the comparator circuit CMP_EN of FIG. 11 and the enable signal EN is controlled, the automatic switching of the number of phases described above can be achieved. For example, for each of POL[1]-POL[3], the values of the resistors R10, R11, and R12 described in FIG. 11 are adequately adjusted to set the above-described relatively high threshold voltage (i.e., the voltage level of PN12), which is used in causing EN[1], EN[2], and EN[3] of POL[1], POL[2] and POL[3] to transition to an active state, to V1, V2, and V3 (V1<V2<V3), respectively. As a result, the number of phases automatically increases as the consumption current of the load LOD increases. Note that, if it is assumed that the operation of the master device is always enabled, then V1 may be fixed to the GND level (0 V) or the like and R10-R12 of FIG. 11 in POL[1] may be omitted. Moreover, the hysteresis characteristic of CMP_EN[1]-CMP_EN[3] described above is provided for preventing the switching of EN associated with a noise-like fluctuation of SHR.

<<Description of Main Effects>>

As described above, by use of the power source device of Embodiment 3, representatively, a multi-phase power source device capable of easily changing (including dynamically changing) the number of phases can be realized, as with the case in Embodiment 2. Moreover, a reduction in the size of the power source device, the stabilization of the multi-phase operation, and an improvement in the power conversion efficiency, and the like can be achieved. Furthermore, in addition to the effects of Embodiment 3, a dynamic change of the number of phases of the multi-phase operation also can be automatically performed.

Embodiment 4

<<Circuit Configuration of the Semiconductor Device>>

Figure 12:
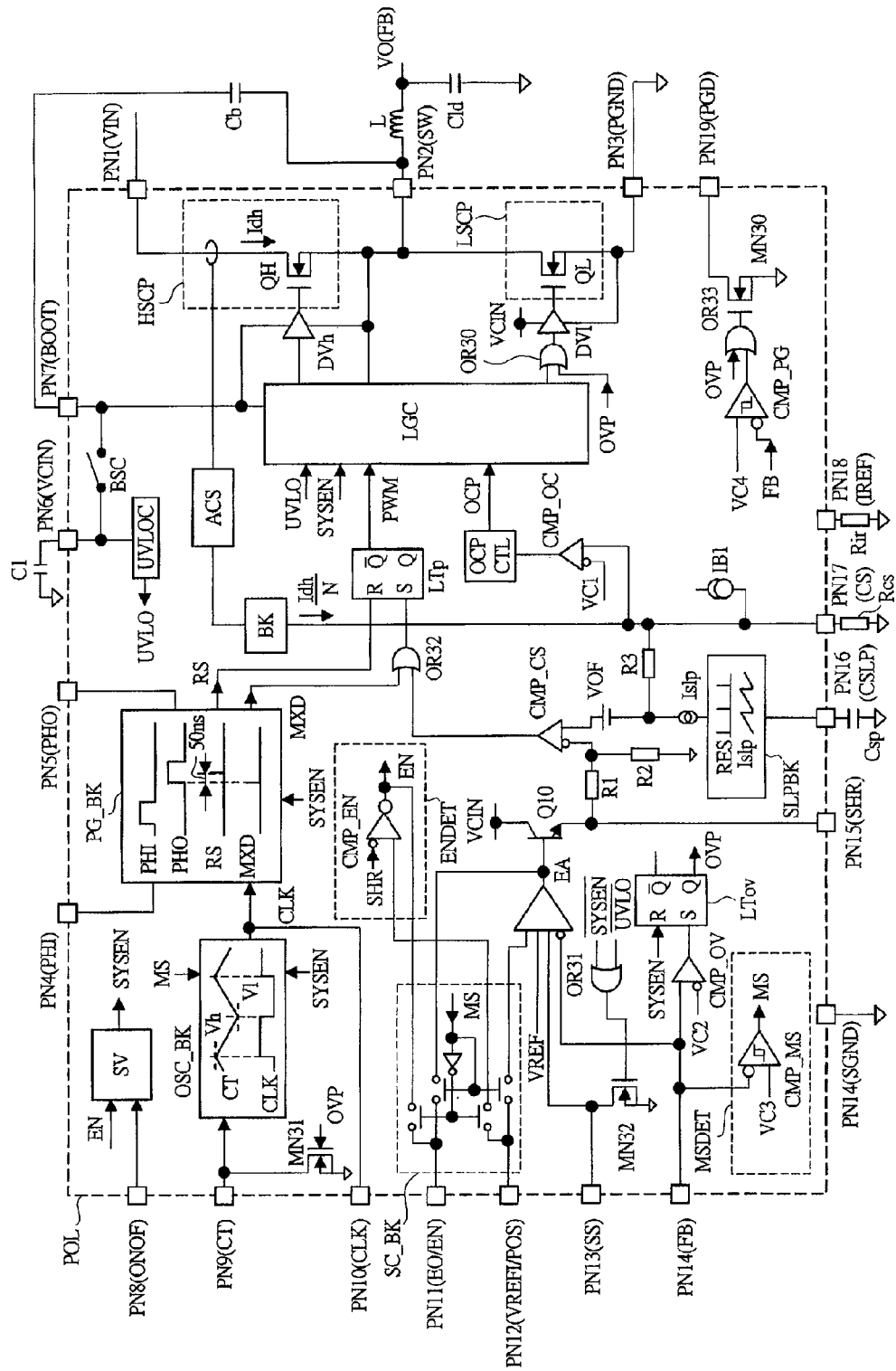
FIG. 12 is a block diagram showing an example of the detailed configuration of a semiconductor device (drive unit) included in a power source device according to Embodiment 4 of the present invention.

In Embodiment 4, an example of the more detailed configuration of each semiconductor device (drive unit POL) constituting the power source device described in Embodiment 3 is described. FIG. 12 is a block diagram showing an example of the detailed configuration of a semiconductor device (drive unit) included in a power source device according to Embodiment 4 of the present invention. As shown in FIG. 12, the drive unit POL basically includes the high side transistor (power transistor) QH, the low side transistor (power transistor) QL, and a circuit group other than these, i.e., various types of control circuits controlling each of the transistors. QH and QL are n-channel MOSFETs, for example. QH is formed in a high-side semiconductor chip HSCP, QL is formed in a low-side semiconductor chip LSCP, and other various types of control circuits are formed in a control semiconductor chip CTLCP to be described later. The respective semiconductor chips are mounted, for example, in one semiconductor package as described later.

In the transistor QH, the gate thereof is driven by the driver circuit DVh, the drain is coupled to the external terminal PN1 to which the input power source voltage VIN is supplied, and the source is coupled to the external terminal (output terminal) PN2 serving as the switch signal SW generation terminal. In QL, the gate thereof is driven by the driver circuit DVl, the drain is coupled to PN2 (SW), and the source is coupled to the external terminal PN3 to which a ground power source voltage PGND is supplied. The PN3 (PGND) is the terminal dedicated for QH, QL, and is provided separately from a ground power source voltage SGND for other various types of control circuits and the like so as not to provide switching noise to the other various types of control circuits and the like.

The active-current detection circuit ACS includes, for example, a transistor (QH') which, together with the transistor QH, constitutes a current mirror circuit in the semiconductor chip HSCP. The transistor (QH') is formed in a transistor size having, for example, 1/N (N=21000 etc.) the size of the transistor QH, whereby a current Idh flowing through QH is detected. The current (Idh/N) detected by ACS is input to a blanking circuit BK. BK sets the switching periods of QH and QL to a masking period (e.g., 50 ns etc.), and supplies the current (Idh/N) from ACS to the external terminal PN17 except this masking period. An external resistor Rcs for current to voltage conversion is coupled to PN17 (CS), whereby the current (Idh/N) from ACS is converted to a voltage as the current detection signal CS. Note that a bias current source IB1 for stabilization is coupled to PN17 (CS).

The driver circuit DVh drives the transistor QH based on the control from the control logic circuit LGC, and the driver circuit DVl drives the transistor QL based on the control via an OR operation circuit OR30 from LGC. In OR30, a control signal from LGC is input to one of two inputs, and an overvoltage detection signal OVP is input to the other input. When OVP is in an active state (the output power source node VO is in an overvoltage state), QL is turned on via OR30, thereby attempting to recover from the overvoltage state. OVP is output from a latch circuit LTov. LTov drives OVP to an active state in response to an 'H' level signal from a comparator circuit CMP_OV, and drives OVP to an inactive state in response to the active state of a system enable signal SYSEN. CMP_OV outputs an 'H' level signal when the feedback signal FB serving as a signal, which is input from the external terminal PN14 and reflects the voltage of the output power source node VO, is higher than a predetermined comparison voltage VC2.

The power source voltage VCIN (e.g., 5 V etc.) for an internal circuit operation is supplied to an external terminal PN6. An external capacitor C1 for voltage stabilization or an internal power source voltage detection circuit UVLOC is coupled to PN6. UVLOC activates an internal power source voltage detection signal UVLO when VCIN has reached a predetermined voltage level. A boost voltage BOOT is generated at an external terminal PN7 and supplied as the power source voltage of the driver circuit DVh. PN7 (BOOT) is coupled to PN6 (VCIN) via a boost switch BSC, and also coupled to the external terminal (output terminal) PN2 (SW) via an external boosting capacitor Cb. When the transistor QH is OFF, the power source voltage VCIN is applied to this Cb via BSC and PN7 (BOOT). Subsequently, when QH is turned on, the input power source voltage VIN transferred to PN2 (SW) is boosted by this Cb and supplied to DVh. Thus, DVh can generate a voltage of the threshold of QH or more.

An on/off signal ONOF for enabling/disabling the corresponding drive unit from the outside is input to an external terminal PN8. For example, in such a case of the power source device of FIG. 8 described in Embodiment 2, this ONOF may be used as the enable signal EN. A system monitoring circuit SV activates the system enable signal SYSEN when both the on/off signal ONOF and the enable signal EN are in an active state. An external resistor Rir is coupled to an external terminal PN18. Although not illustrated, POL generates a reference current IREF corresponding to this Rir, which is then used in various types of internal circuits. The ground power source voltage SGND for various types of control circuits is supplied to an external terminal PN14.

The oscillator circuit block OSC_BK described in Embodiment 3 is coupled to external terminals PN9, PN10. The clock control signal CT is generated at PN9 and the clock signal CLK is transmitted to PN10. Moreover, an n-channel MOS transistor MN31 is connected between PN9 and the ground power source voltage SGND. When the overvoltage detection signal OVP described above is in an active state, this MN31 is turned on to stop the oscillation operation in OSC_BK. OSC_BK controls each switch inside described above in response to the master/slave control signal MS and the system enable signal SYSEN in place of the enable signal EN described in FIG. 10. For example, in order to enable the automatic phase switching function described in Embodiment 3, the on/off signal ONOF from PN8 is always activated and accordingly SYSEN serves as the signal corresponding to EN. On the other hand, in forcibly stopping the phase from the outside, the corresponding ONOF is deactivated and SYSEN is driven to an inactive state.

The phase signal generation circuit block PG_BK described in Embodiment 3 is coupled to the external terminals PN4, PN5. The phase input signal PHI is input to PN4, and the phase output signal PHO is output from PN5. As with the oscillator circuit block OSC_BK, PG_BK controls each switch inside described above in response to the system enable signal SYSEN in place of the enable signal EN described in FIG. 10. Moreover, PG_BK outputs the reset signal RS and a max_delay signal MXD in addition to PHO.

For example, RS is output in 50 ns after a rising edge of PHO, and MXD is output at the same timing as the rising edge of PHO.

A switch block SC_BK to be described later is coupled to the external terminals PN11, PN12. PN11 is a terminal used both for outputting the error amplifier signal EO from the error amplifier circuit EA and for outputting the enable signal EN from the enable detection circuit ENDET described in Embodiment 3. PN12 is a terminal used both for applying an external reference voltage VREFI to EA and for setting the hysteresis characteristic in ENDET described in Embodiment 3 (i.e. for POS). ENDET includes the comparator circuit CMP_EN as described in Embodiment 3. CMP_EN determines the common control signal SHR obtained at the external terminal PN15 with reference to a threshold voltage, which is input via SC_BK and has a hysteresis characteristic, and outputs the enable signal EN.

A soft start control signal SS is input to an external terminal PN13. An n-channel MOS transistor MN32 is coupled between PN13 and SGND, and MN32 is turned on via an OR operation circuit OR31 when SYSEN is in an inactive state or UVLO is in an inactive state. Although not illustrated, for example, an external capacitor and a charge circuit therefor are coupled to PN13. Therefore, when SYSEN is in an inactive state (the state where the corresponding POL is set to a disabled state) or when UVLO is in an inactive state (the state where the voltage of the power source voltage VCIN is insufficient), an external capacitor coupled to PN13 is set to a discharge state, and subsequently when SYSEN or UVLO transitions to an active state, the charge operation of the external capacitor is started. Thus, SS whose voltage level gradually rises is obtained at PN13.

In the error amplifier circuit EA, the feedback signal FB from the external terminal PN14 is input to the (−) input node, while VREFI via SC_BK from PN12, the internally generated reference voltage VREF, and the soft start control signal SS are input to three (+) input nodes, respectively. EA amplifies FB with reference to the lowest voltage among the voltages at the three (+) input nodes, and outputs the error amplifier signal EO. This EO is input to the base of a bipolar transistor Q10 whose collector is coupled to VCIN, and is output to the external terminal PN15 via the emitter of Q10. The signal obtained at this PN15 serves as the common control signal SHR. Note that Q10 functions as a diode.

SHR is applied through the resistance voltage division by the resistors R1, R2 to the (−) input node of the comparator circuit CMP_CS. The current detection signal CS described above is input to the (+) input node of CMP_CS via the resistor R3 and an offset voltage source VOF. A slope compensation circuit block SLPBK is coupled to the connection node of VOF and R3. SLPBK is also coupled to an external capacitor Csp for slope compensation via an external terminal PN16. SLPBK performs slope compensation on CS to prevent the so-called sub-harmonic oscillation which may occur in the peak current method described above.

The output of the comparator circuit CMP_CS is coupled to one of the input nodes of the OR operation circuit OR32. The max_delay signal MXD from the phase signal generation circuit block PG_BK described above is input to the other input node of OR32. The output of OR32 is coupled to a set (S) input node of a set-reset type latch circuit LTp. The reset signal RS from PG_BK described above is input to a reset (R) input node of LTp. LTp outputs the PWM signal PWM from a negative polarity output node (/Q). Note that MXD is a signal for forcibly driving PWM to an off-level when the on-duty of PWM reaches the vicinity of 100%.

The control logic circuit LGC controls the switching of the transistors QH, QL via the driver circuits DVh, DVl using PWM from the latch circuit LTp. Moreover, the internal power source voltage detection signal UVLO, the system enable signal SYSEN, and the overcurrent detection signal OCP are input to LGC. OCP is generated by the overcurrent control circuit OCPCTL, based on a determination result of the current detection signal CS with reference to the comparison voltage VC1 by the comparator circuit CMP_OC. LGC turns off the transistors QH, QL when UVLO is in an inactive state (the state where the power source voltage VCIN is insufficient), when SYSEN is in an inactive state (the state where the corresponding POL is set to a disabled state), or when OCP is in an active state (the state where an excessive current flows through the transistor QH).

Moreover, a master/slave detection circuit MSDET is coupled to the external terminal PN14 (FB). MSDET includes a comparator circuit CMP_MS, and CMP_MS determines the voltage level of PN14 with reference to a comparison voltage VC3, and outputs the master/slave control signal MS. That is, as shown in FIG. 10 etc., in the case of the master device (POL[1]), the feedback signal FB is input to PN14 while in the case of the slave device (POL[2], POL[3]), PN14 is fixed to an 'H' level (the VCIN (5 V etc.) level). The voltage level of FB, the detail of which is described later, is a value obtained by the resistance voltage division of the voltage (e.g., 1.2 V etc.) of the output power source node VO. Accordingly, for example, if VC3 is set to a voltage (VCIN× 70% etc.) which is slightly lower than the VCIN level, then it is possible to determine whether the relevant device is the master device or the slave device.

A power_good signal PGD is generated at an external terminal PN19. An n-channel MOS transistor MN30 is coupled between PN19 and the ground power source voltages SGND. Turning on/off of MN30 is controlled by the output of an OR operation circuit OR33. The overvoltage detection signal OVP is input to one input node of OR33. The other input node of OR33 is coupled to the output of a comparator circuit CMP_PG. CMP_PG is a circuit which determines the voltage level of the feedback signal FB with reference to a comparison voltage VC4 and detects that the voltage level of FB is not too low. Accordingly, if the voltage level of FB (i.e., the voltage level of the output power source node VO) is within an appropriate range (neither too low nor too high), PGD becomes an active state ('H' level).

<<Details Around the Switch Block>>

Figure 13A:
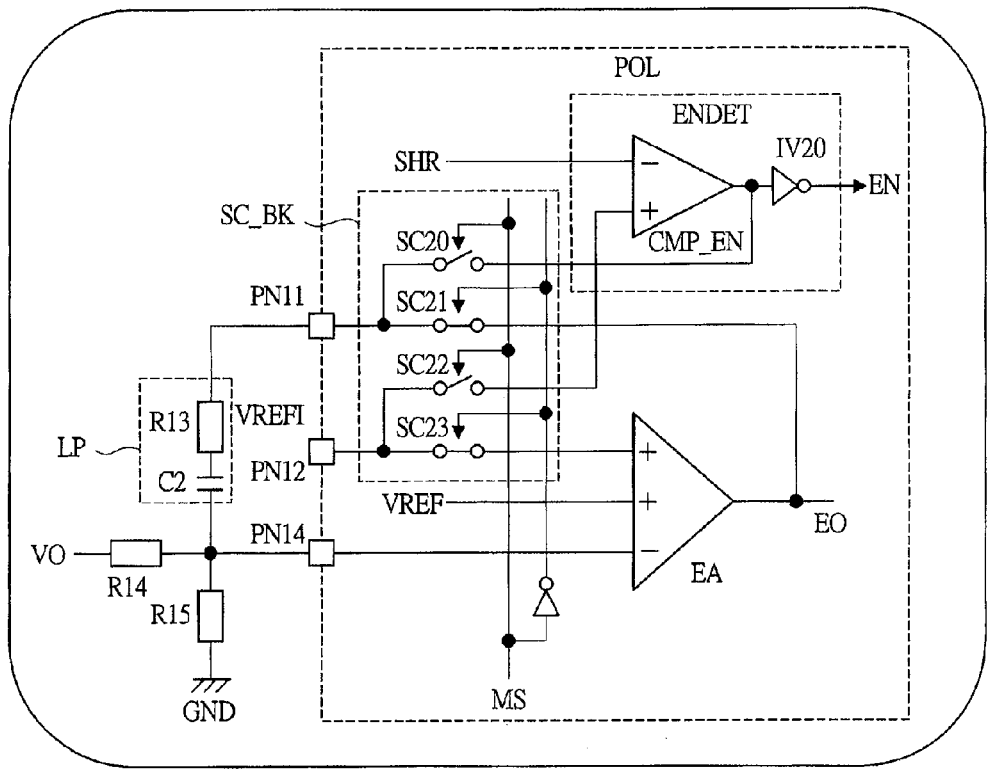
FIG. 13A is a circuit diagram showing an example of the detailed configuration around a switch block when the semiconductor device of FIG. 12 is a master device.
Figure 13B:
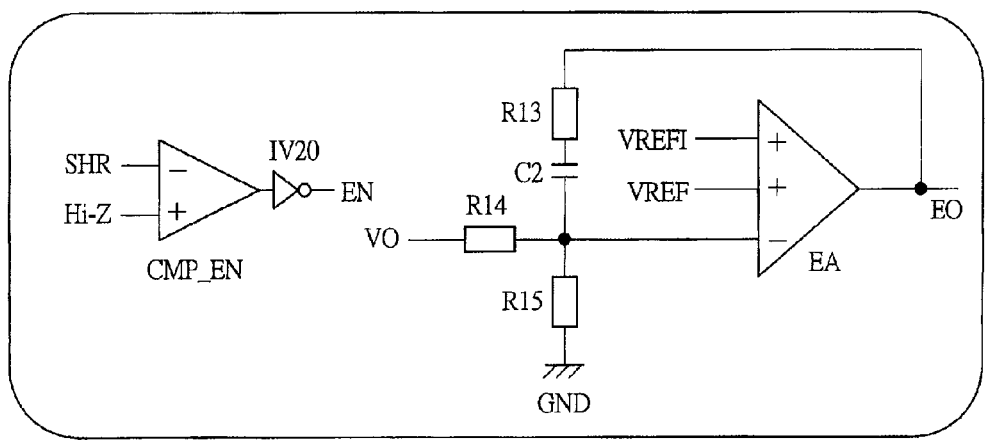
FIG. 13B is an equivalent circuit diagram showing a state of an enable detection circuit and an error amplifier circuit in FIG. 13A.
Figure 14A:
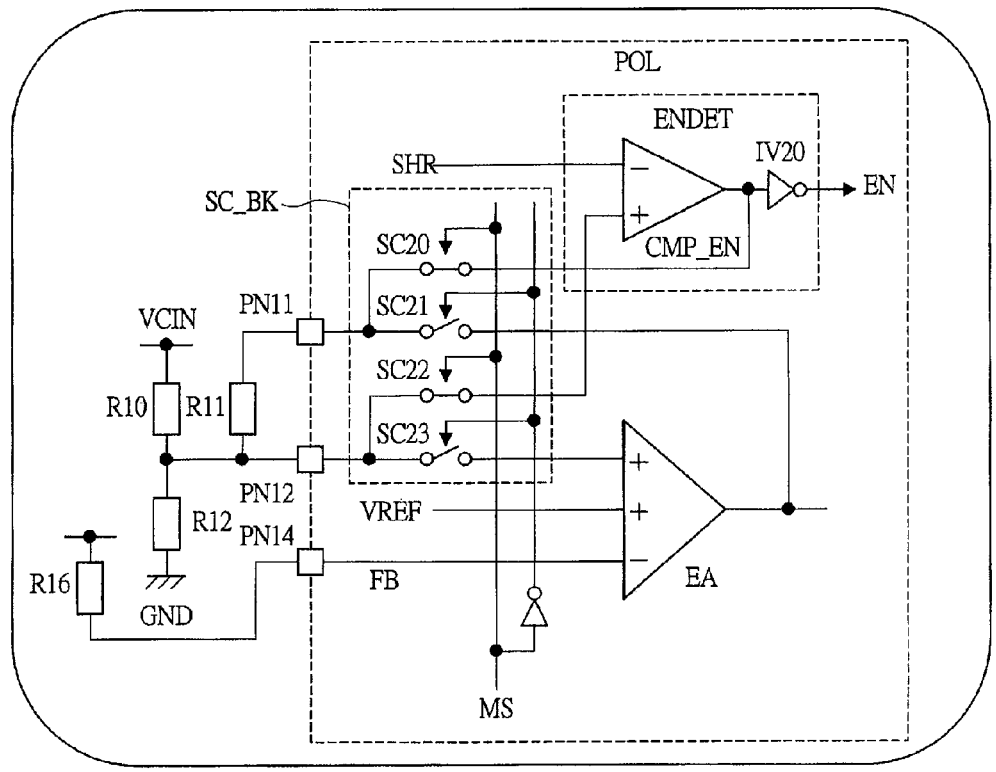
FIG. 14A is a circuit diagram showing an example of the detailed configuration around the switch block when the semiconductor device of FIG. 12 is a slave device.
Figure 14B:
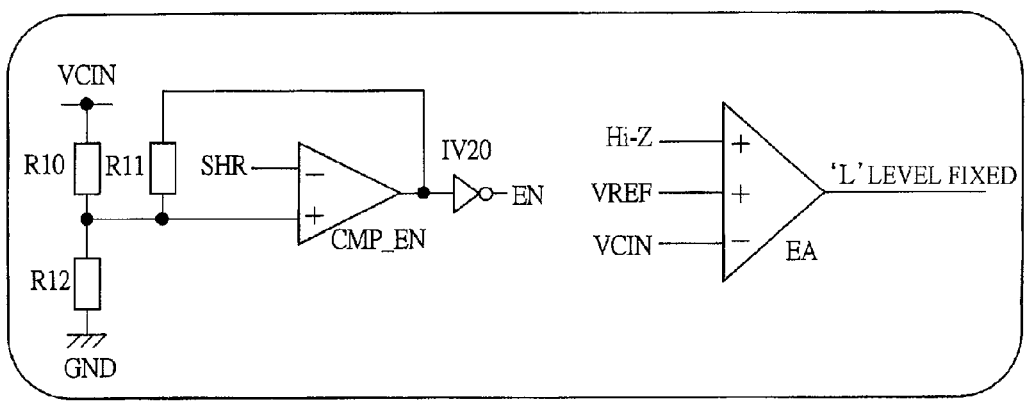
FIG. 14B is an equivalent circuit diagram showing a state of the enable detection circuit and the error amplifier circuit in FIG. 14A.

FIG. 13A is a circuit diagram showing an example of the detailed configuration around the switch block SC_BK when the semiconductor device of FIG. 12 is the master device. FIG. 13B is an equivalent circuit diagram showing a state of the enable detection circuit ENDET and the error amplifier circuit EA in FIG. 13A. FIG. 14A is a circuit diagram showing an example of the detailed configuration around the switch block SC_BK when the semiconductor device of FIG. 12 is the slave device. FIG. 14B is an equivalent circuit diagram showing a state of the enable detection circuit ENDET and the error amplifier circuit EA in FIG. 14A.

In FIG. 13A, the switch block SC_BK includes four switches SC20-SC23. In SC20 and SC21, one-ends thereof are coupled to the external terminal PN11. The other end of SC20 is coupled to the output of the comparator circuit CMP_EN included in the enable detection circuit ENDET. The other end of SC21 is coupled to the output of the error amplifier circuit EA. In SC22 and SC23, one-ends thereof are coupled to the external terminal PN12. The other end of SC22 is coupled to the (+) input node of CMP_EN. The other end of SC23 is coupled to the (+) input node of EA. SC21 and SC23 are turned on when the master/slave control signal MS has a voltage level of the master side, and are turned off when it has a voltage level of the slave side. On the other hand, SC20 and SC22 are turned on when MS has a voltage level of the slave side, and are turned off when it has a voltage level of the master side. Because FIG. 13A shows an example of the master device (POL[1] of FIG. 10), SC21 and SC23 are turned on.

Between the external terminals PN11 and PN14, an external resistor R13 and an external capacitor C2 are coupled in series sequentially from the PN11 side. R13 and C2 correspond to the loop compensation circuit LP in POL[1] of FIG. 10. Moreover, an external resistor R14 is coupled between PN14 and the output power source node VO, and an external resistor R15 is coupled between PN14 and the ground power source voltage GND. Both R14 and R15 have an identical resistance value in the range from several tens to several hundreds kO, for example.

If such a configuration example is used, the comparator circuit CMP_EN and the error amplifier circuit EA equivalently become the state as shown in FIG. 13B. That is, in CMP_EN, the (+) input node becomes a high impedance (Hi-Z) state, wherein by setting the (+) input node to the GND level, an 'L' level is always output from CMP_EN and the enable signal EN is always at an 'H' level (in an active state) through the inversion operation by an inverter circuit IV20. Moreover, the error amplifier circuit EA amplifies a value, which is obtained by dividing the voltage level of VO by the resistance voltage division by R14 and R15, with reference to the reference voltage VREF (e.g., 0.6 V etc.) or the external reference voltage VREFI from PN12, and outputs the error amplifier signal EO.

On the other hand, in FIG. 14A, although the configuration of the switch block SC_BK is the same as that in the case of FIG. 13A, SC20 and SC22 are turned on here because this is the example of the slave device (POL[2], POL[3] of FIG. 10). Moreover, unlike the case of FIG. 13A, the external resistor R11 is coupled between the external terminals PN11 and PN12, the external resistor R10 is coupled between PN12 and the power source voltage VCIN, and the external resistor R12 is coupled between PN12 and GND. Furthermore, an external resistor R16 is coupled between the external terminal PN14 and VCIN.

If such a configuration example is used, the comparator circuit CMP_EN and the error amplifier circuit EA equivalently become the state as shown in FIG. 14B. That is, CMP_EN functions as the hysteresis comparator as described in FIG. 11 and controls the active state/inactive state of the enable signal EN in response to the voltage level of the common control signal SHR. Moreover, because the power source voltage VCIN is input to the (−) input node, the error amplifier circuit EA amplifies the VREF of the (+) input node and the output thereof is fixed to an 'L' level (approximately 0 V level). Accordingly, in the slave device, the output of EA is isolated from the common control signal SHR at the external terminal PN15 by the transistor Q10 in FIG. 12.

As described above, if the semiconductor device of FIG. 12 is used, the power source device of FIG. 10 described above can be realized with the external terminals PN11, PN12 as the shared terminals which perform different functions in the master device and in the slave device, respectively. Thus, the number of external terminals can be reduced, and a reduction in the size of the power source device (semiconductor device) and the like can be achieved. Note that, here, by means of the switch block SC_BK, PN11 is coupled to the output of CMP_EN or the output of EA and PN12 is coupled to the input of CMP_EN or the input of EA, however, the combination thereof can be adequately modified, for example, such as that PN11 is coupled to the input of CMP_EN or the output of EA and PN12 is coupled to the output of CMP_EN or the input of EA.

<<Package Configuration of the Semiconductor Device>>

Figure 15:
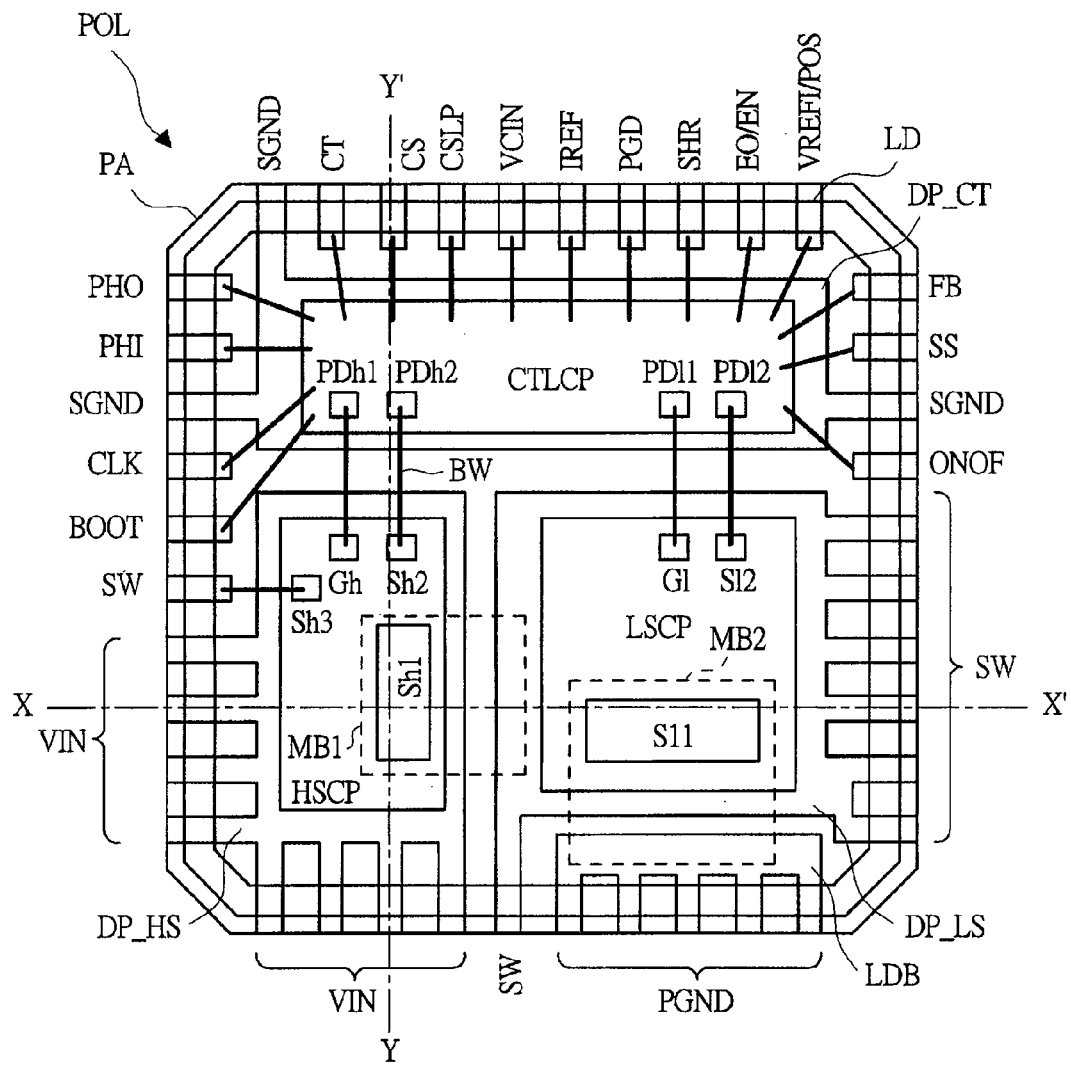
FIG. 15 is a plan view showing an example of the schematic package configuration of the semiconductor device (drive unit) of FIG. 12.
Figure 16A:
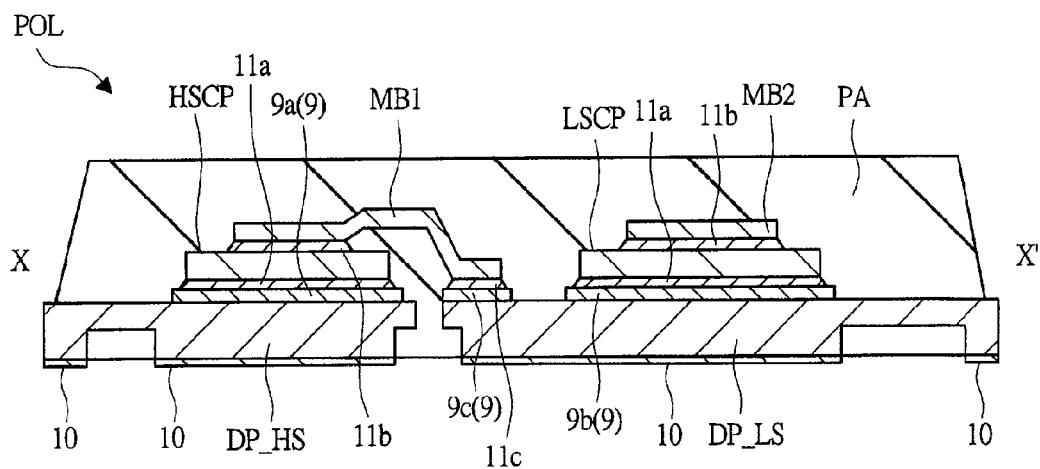
FIG. 16A is a cross sectional view showing an example of the structure along X-X' in FIG. 15.
Figure 16B:
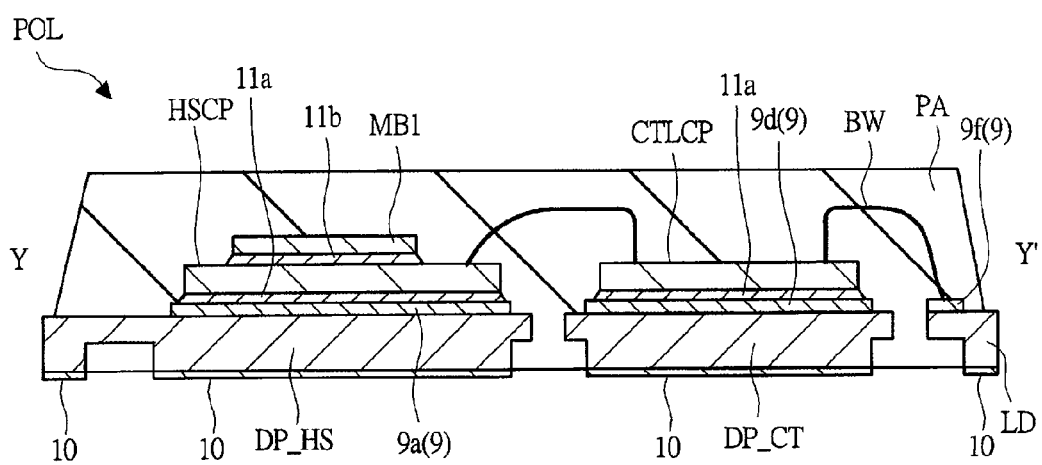
FIG. 16B is a cross sectional view showing an example of the structure along Y-Y' in FIG. 15.

FIG. 15 is a plan view showing an example of the outline package configuration of the semiconductor device (drive unit) POL of FIG. 12. FIG. 16A is a cross sectional view showing an example of the structure along X-X' in FIG. 15. FIG. 16B is a cross sectional view showing an example of the structure along Y-Y' in FIG. 15.

The semiconductor device (drive unit) POL shown in FIG. 15 has a QFN (Quad Flat Non-leaded package) surface mount semiconductor package (sealed body) PA, for example. The material of PA is, for example, an epoxy resin or the like. PA includes three die pads DP_HS, DP_LS, and DP_CT, each having a semiconductor chip mounted therein, a lead wire LDB, and a plurality of leads LD serving as external terminals. DP_HS, DP_LS, DP_CT, and LDB have a generally rectangular planar shape, respectively. DP_HS and DP_LS are disposed adjacent to each other in about ⅔ area of the plane area in PA, and DP_CT is disposed in about the remaining ⅓ area. LDB is disposed between one side of DP_LS and one side on PA proximally facing thereto.

In the upper surfaces of the die pads DP_HS, DP_LS, and DP_CT, the semiconductor chips HSCP, LSCP, and CTLCP are mounted via a plated layer, respectively. As described in FIG. 12, the high side transistors (power transistors) QH, QH' are formed in the semiconductor chip HSCP, the low side transistor (power transistor) QL is formed in the semiconductor chip LSCP, and other various types of control circuits are formed in the semiconductor chip CTLCP. Here, the area of LSCP is designed approximately two times larger than the area of HSCP. For example, when the input power source voltage VIN of 12 V is converted to the output power source voltage of 1.2 V, the time to turn on QL is approximately ten times longer than the time to turn on QH. Therefore, the area of LSCP is increased so that the on-resistance thereof may be reduced and the power efficiency of the power source device can be increased. Moreover, in each of the die pads DP_HS, DP_LS, and DP_CT, the lower surface thereof is exposed from the backside of PA (see FIG. 16). Among these, the exposed area of DP_LS is the largest and the exposed area of DP_HS is the second largest. Thereby, the on-resistance of QL in particular can be reduced and the radiation performance thereof also can be increased.

The semiconductor chip HSCP includes a drain electrode in the backside, and includes source electrodes Sh1-Sh3 and a gate electrode Gh in the surface. Thus, the drain electrode is electrically coupled to DP_HS. The source electrodes Sh1-Sh3 are coupled to each other using an internal wiring of HSCP. Moreover, the semiconductor chip LSCP includes a drain electrode in the backside, and includes source electrodes S11, S12 and a gate electrode G1 in the surface. This drain electrode is electrically coupled to DP_LS. The source electrodes S11, S12 are coupled to each other using an internal wiring of LSCP. Moreover, the semiconductor chip CTLCP includes a plurality of electrodes including electrodes PDh1, PDh2, PD11, and PD12 in the surface. The backside of CTLCP is electrically coupled to DP_CT.

In the periphery of the die pad DP_HS, a plurality of (here, eight) leads (external terminals) LD used for the input power source voltage VIN and a lead LD used for the switch signal SW are disposed. Among these, the leads LD used for VIN are formed integrally with DP_HS. Accordingly, the drain electrode of HSCP is electrically coupled to the lead LD for VIN via DP_HS. In the periphery of the die pad DP_LS, a plurality of (here, seven) leads LD used for SW is disposed. The leads LD used for SW are formed integrally with DP_LS. Accordingly, the drain electrode of LSCP is electrically coupled to the leads LD used for SW via DP_LS. In the periphery of lead wire LDB, a plurality of (here, five) leads LD used for the ground power source voltage PGND is disposed. The leads LD used for PGND are formed integrally with LDB.

In the periphery of the die pad DP_CT, a plurality of (here, three) leads LD used for the ground power source voltage SGND is disposed. The leads LD used for SGND are formed integrally with DP_CT. Accordingly, the backside of CTLCP is electrically coupled to the leads LD used for SGND via DP_CT. Furthermore, in the periphery of DP_CT, 16 leads LD are disposed. These are used for BOOT, for CLK, for PHI, for PHO, for CT, for CS, for CSLP, for VCIN, for IREF, for PGD, for SHR, for EO/EN, for VREFI/POS, for FB, for SS, and for ONOF, respectively, as shown in FIG. 12. These leads LD are respectively coupled to a predetermined electrode provided in the surface of CTLCP, via the plated layer and a bonding wire BW.

The package PA shown in FIG. 15 further includes two metal plates (conductor plates) MB1, MB2. MB1 and MB2 are formed from a metal having a high electric conductivity and a high thermal conductivity represented by copper (Cu), for example. MB1 couples the source electrode Sh1 provided above the semiconductor chip HSCP to the die pad DP_LS. Thus, the source of the transistor QH in HSCP is coupled to the lead LD for the switch signal SW. MB2 couples the source electrode S11 provided above the semiconductor chip LSCP to the lead wire LDB. Thus, the source of the transistor QL in LSCP is coupled to the lead LD for the ground power source voltage PGND.

The source electrode Sh3 provided above the semiconductor chip HSCP is coupled to the lead LD for SW which is disposed in the periphery of DP_HS via the bonding wire BW. The gate electrode Gh and source electrode S2h provided above HSCP are coupled to the electrodes PDh1, PDh2 provided above the semiconductor chip CTLCP, via BW, respectively. The gate electrode G1 and source electrode S12 provided above LSCP are coupled to the electrodes PD11 and PD12 provided above CTLCP, via BW, respectively. PDh1 and PDh2 correspond to the output node and reference voltage node of the driver circuit DVh, respectively, in FIG. 12, and PD11 and PD12 correspond to the output node and reference voltage node of the driver circuit DVl, respectively, in FIG. 12.

Moreover, as shown in FIGS. 16A, 16B, a plated layer 10 is formed above the lower surface of the lead LD exposed in the backside of the package PA and above the lower surfaces of the die pads DP_HS, DP_LS, and DP_CT. The plated layer 10 is a solder plating layer, and is the plated layer formed after the formation of package PA. The plated layer 10 is provided so as to facilitate a soldering connection to a wiring board (PCB) when POL is mounted onto this PCB. The semiconductor chip HSCP is coupled onto the upper surface of DP_HS via a plated layer 9a and an adhesive layer 11a. The semiconductor chip LSCP is coupled onto the upper surface of DP_LS via a plated layer 9b and the adhesive layer 11a. The semiconductor chip CTLCP is coupled onto the upper surface of DP_CT via a plated layer 9d and the adhesive layer 11a.

Furthermore, HSCP and LSCP are coupled to the metal plates MB1, MB2 via an adhesive layer 11b, respectively. MB1 is coupled to DP_LS via an adhesive layer 11c and a plated layer 9c. Moreover, the bonding wire BW from CTLCP is coupled to the lead LD via a plated layer 9f. The adhesive layers 11a-11c are formed from solder. Each of the die pads DP_HS, DP_LS, and DP_CT, the lead wire LDB, and the lead LD is formed from a metal, for example, such as copper (Cu), as the main material. Each of the plated layers 9a, 9b, 9c, 9d, and 9f is a silver (Ag) plated layer or a gold (Au) plated layer, for example.

By packaging a plurality of semiconductor chips into one semiconductor package in this manner, a reduction in the size of the power source device can be achieved, and additionally, higher frequency and higher efficiency can be achieved because the wire's parasitic inductance can be reduced. Moreover, by exposing the lower surface of each of the die pads DP_HS, DP_LS, and DP_CT as an electrode from the backside of the package PA, lower resistance of the electrode and higher radiation performance can be achieved. Furthermore, by making connection using two metal plates (conductor plates) MB1, MB2, lower resistance in the connection part and higher radiation performance can be achieved as compared with the case where the bonding wire BW is used.

<<Device Structure of the Semiconductor Device>>

Figure 17:
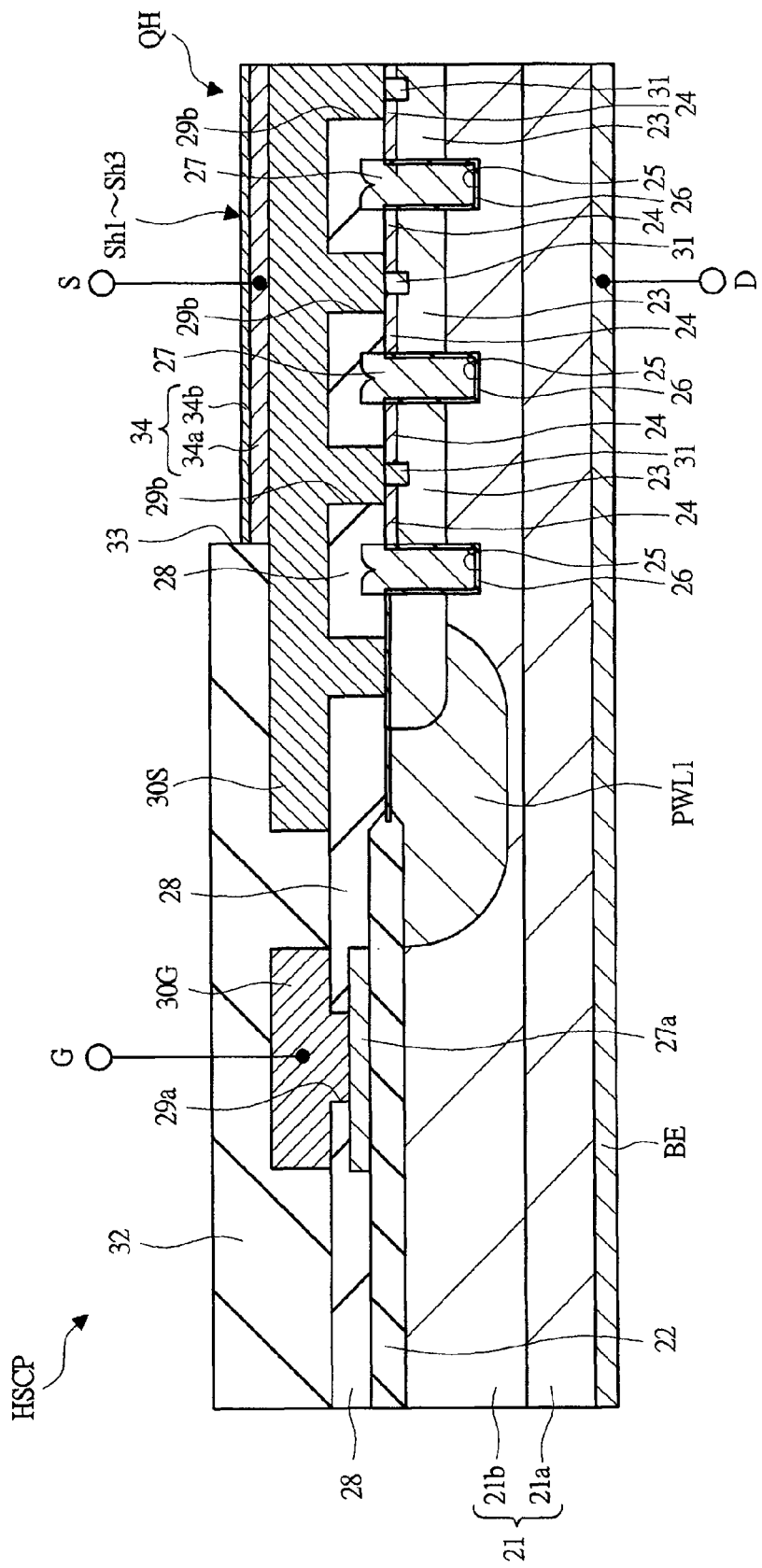
FIG. 17 is a cross sectional view showing an example of the device structure of a semiconductor chip having a high side transistor (power transistor) formed therein, in the semiconductor device of FIG. 12.

FIG. 17 is a cross sectional view showing an example of the device structure of the semiconductor chip HSCP having the high side transistor (power transistor) formed therein, in the semiconductor device of FIG. 12. Here, although the high side transistor QH (and QH') is taken as an example, the low side transistor QL also has the same structure. The transistor QH (QH') is formed in the principal surface of a semiconductor substrate 21 including a substrate body 21a comprising an n$^+$ single crystal silicon and the like and an epitaxial layer 21b comprising an n$^-$ silicon single crystal and the like. In the principal surface of the epitaxial layer 21b, a field insulating film (element isolating region) 22 comprising, for example, silicon oxide and the like is formed.

In an active region surrounded by the field insulating film 22 and a p-well PWL1 thereunder, a plurality of unit transistor cells constituting QH, QH' is formed. QH is formed by coupling these unit transistor cells in parallel. On the other hand, QH' is formed by setting the number of unit transistor cells coupled in parallel to 1/21000 of QH, for example. Each unit transistor cell is formed of an n-channel power MOS transistor with a trench gate structure, for example.

The substrate body 21a and the epitaxial layer 21b have the function as the drain region of the unit transistor cell. In the backside of the semiconductor substrate 21, a backside electrode BE for the drain electrode is formed. The backside electrode BE is formed, for example, by stacking a titanium (Ti) layer, a nickel (Ni) layer, and a gold (Au) layer sequentially from the backside of the semiconductor substrate 21. In POL shown in FIGS. 16A and 16B, the backside electrode BE is bonded to the die pad DP_HS (plated layer 9a) via the adhesive layer 11a and is electrically coupled thereto.

Moreover, a p-type semiconductor region 23 formed in the epitaxial layer 21b has the function as a channel forming region of the above-described unit transistor cell. Furthermore, an n$^+$-type semiconductor region 24 formed in the upper side of the p-type semiconductor region 23 has the function as the source region of the unit transistor cell. Moreover, in the semiconductor substrate 21, a groove 25 extending in the thickness direction of the semiconductor substrate 21 from the principal surface is formed. The groove 25 is formed so as to extend from the upper surface of the n$^+$-type semiconductor region 24 through the n$^+$-type semiconductor region 24 and p-type semiconductor region 23 and terminate in the epitaxial layer 21b thereunder. In the bottom surface and side face of the groove 25, a gate insulating film 26 comprising silicon oxide, for example, is formed.

In the groove 25, a gate electrode 27 is embedded via the gate insulating film 26. The gate electrode 27 comprises a polysilicon film doped with an n-type impurity, for example. The gate electrode 27 has the function as the gate electrode of the unit transistor cell. Moreover, also in apart above the field insulating film 22, a gate lead-out wiring part 27*a* comprising an electrical conductive film of the same layer as the gate electrode 27 is formed, and the gate electrode 27 and the gate lead-out wiring part 27*a* are integrally formed to electrically couple to each other. Note that, in a region not illustrated in the cross sectional view of FIG. 17, the gate electrode 27 and the gate lead-out wiring part 27*a* are integrally coupled to each other. The gate lead-out wiring part 27*a* is electrically coupled to a gate wiring 30G through a contact hole 29*a* formed in the insulation film 28 covering the gate lead-out wiring part 27*a*.

On the other hand, a source wiring 30S is electrically coupled to the $n^+$-type semiconductor region 24 for the source through a contact hole 29*b* formed in the insulation film 28. Moreover, the source wiring 30S is electrically coupled to a $p^+$-type semiconductor region 31, which is formed in the upper part of the p-type semiconductor region 23 and between the adjacent $n^+$-type semiconductor regions 24. Through the $p^+$-type semiconductor region 31, the source wiring 30S is electrically coupled to the p-type semiconductor region 23 for channel formation. The gate wiring 30G and the source wiring 30S can be formed by forming a metal film (e.g., aluminum film) so as to fill the contact holes 29*a*, 29*b* above the insulation film 28 in which the contact holes 29*a*, 29*b* are formed, and patterning this metal film.

The gate wiring 30G and the source wiring 30S are covered with a protective film (insulation film) 32 comprising a polyimide resin or the like. The protective film 32 is a film (insulation film) of the top layer of the semiconductor chip HSCP. In a part of the protective film 32, there is formed an opening 33, through which a part of the gate wiring 30G and a part of the source wiring 30S under the protective film 32 are exposed. Here, the gate wiring 30G portion exposed from the opening 33 serves as the gate electrode Gh and the source wiring 30S portion exposed from the opening 33 serves as the source electrodes Sh1-Sh3. Although the source electrodes Sh1-Sh3 are isolated in the top layer by the protective film 32 in this manner, these are electrically coupled to each other through the source wiring 30S.

In the surface of the electrodes Gh and Sh1-Sh3 (i.e., above the gate wiring 30G portion and source wiring 30S portion exposed in the bottom of the opening 33), a metal layer 34 is formed by plating or the like. The metal layer 34 is formed of a laminated film of a metal layer 34*a* formed above the gate wiring 30G and source wiring 30S and a metal layer 34*b* formed thereabove. The lower metal layer 34*a* comprises nickel (Ni), for example, and has the function to suppress or prevent the oxidization of aluminum of mainly the underlying gate wiring 30G and source wiring 30S. Moreover, the upper metal layer 34*b* comprises gold (Au), for example, and has the function to suppress or prevent the oxidization of nickel of mainly the underlying metal layer 34*a*.

The operating current of the unit transistor cell in such high-side power transistors QH, QH' is adapted to flow in the thickness direction of the substrate 21 along the side face of the gate electrode 27 (i.e., side face of the groove 25) between the epitaxial layer 21*b* for the drain and the $n^+$-type semiconductor region 24 for the source. That is, a channel is formed along the thickness direction of the semiconductor chip HSCP. As described above, the semiconductor chip HSCP is a semiconductor chip in which a vertical MOSFET (power MOSFET) having a trench gate structure is formed. Here, the vertical MOSFET corresponds to a MOSFET, in which a current between the source and drain flows in the thickness direction of the semiconductor substrate (substrate 21) (in the direction generally perpendicular to the principal surface of the semiconductor substrate).

<<Description of Main Effects>>

As described above, by use of the power source device of Embodiment 4, representatively, a multi-phase power source device capable of easily changing (including dynamically changing and automating the dynamic change) the number of phases can be realized, as with the case in Embodiment 3. Moreover, a reduction in the size of the power source device, the stabilization of the multi-phase operation, and an improvement in the power conversion efficiency, and the like can be achieved. Furthermore, the power source device of Embodiment 3 can be realized with a small semiconductor device.

In the foregoing, although the present invention made by the present inventor has been described specifically based on the embodiments, the present invention is not limited to the above embodiments and various modifications may be made without departing from the scope thereof.

<<Modification Example of the Oscillator Circuit Block>>

Figure 18B:
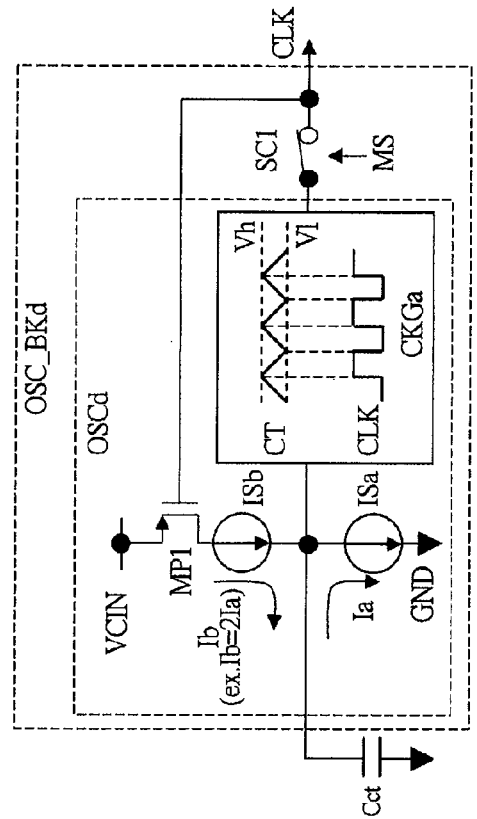
FIG. 18B shows a modification example of the oscillator circuit block of FIG. 3, and is a circuit block diagram of another configuration example.
Figure 18A:
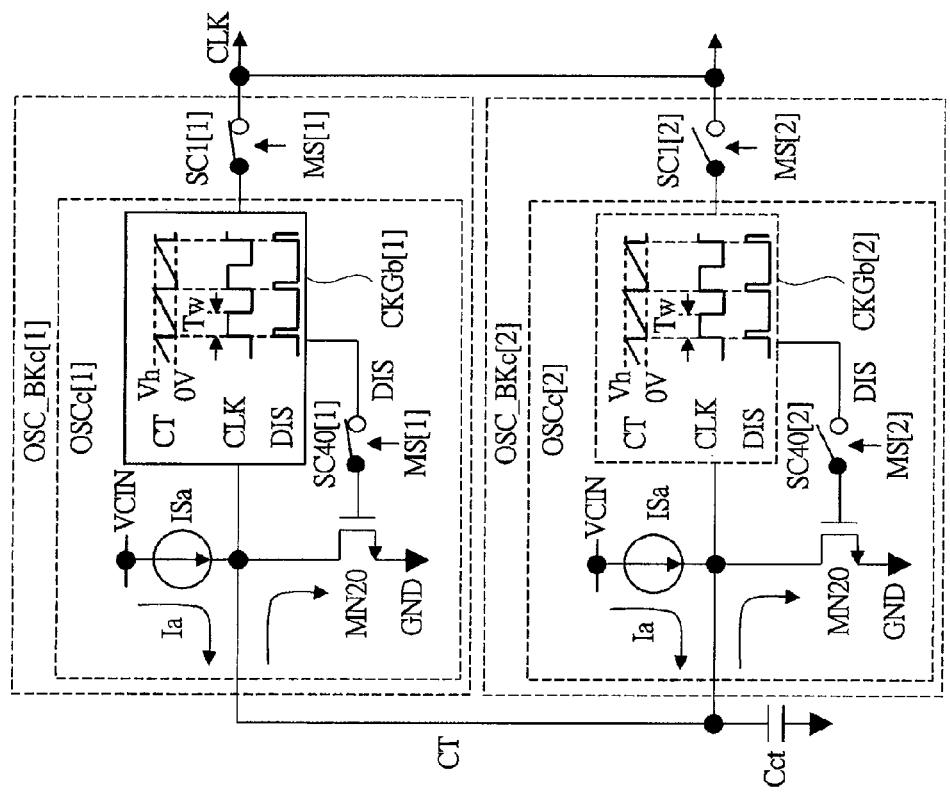
FIG. 18A shows a modification example of the oscillator circuit block of FIG. 3, and is a circuit block diagram of one configuration example.
Figure 19B:
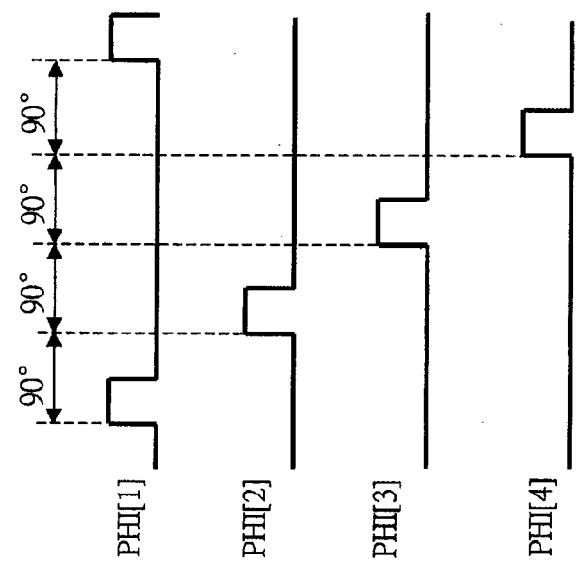
FIG. 19B is a waveform chart showing an operation example of FIG. 19A.
Figure 19A:
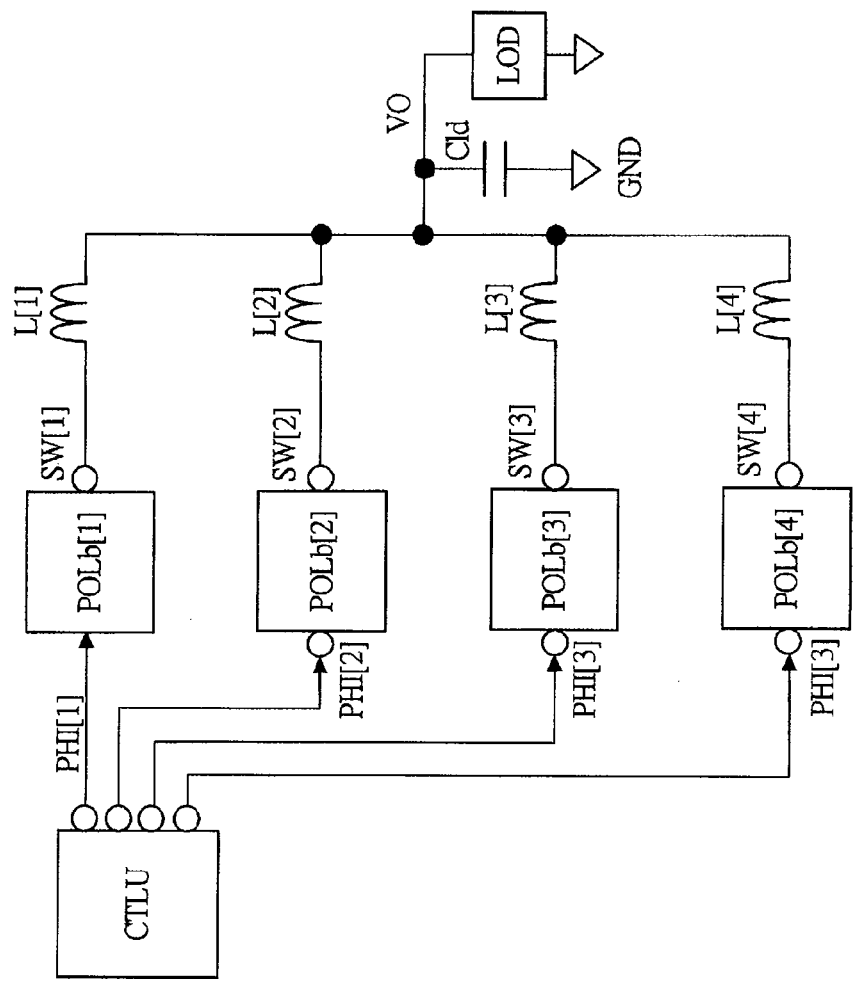
FIG. 19A shows a power source device studied as a prerequisite to the present invention, and is a block diagram showing an example of the outline configuration.
Figure 20B:
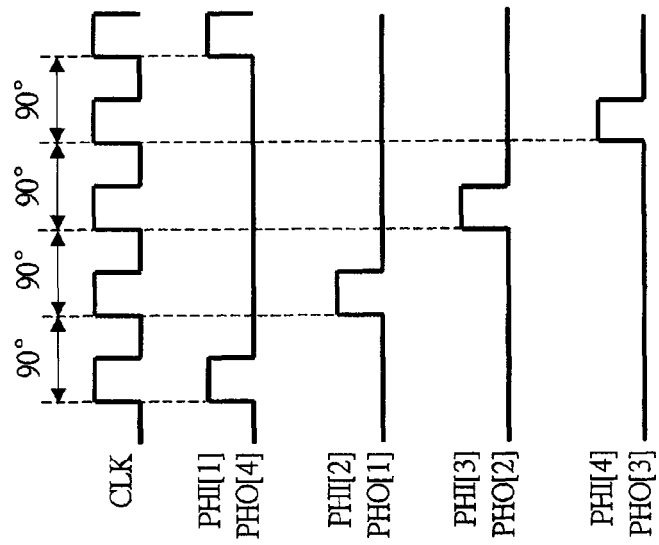
FIG. 20B is a waveform chart showing an operation example of FIG. 20A.
Figure 20A:
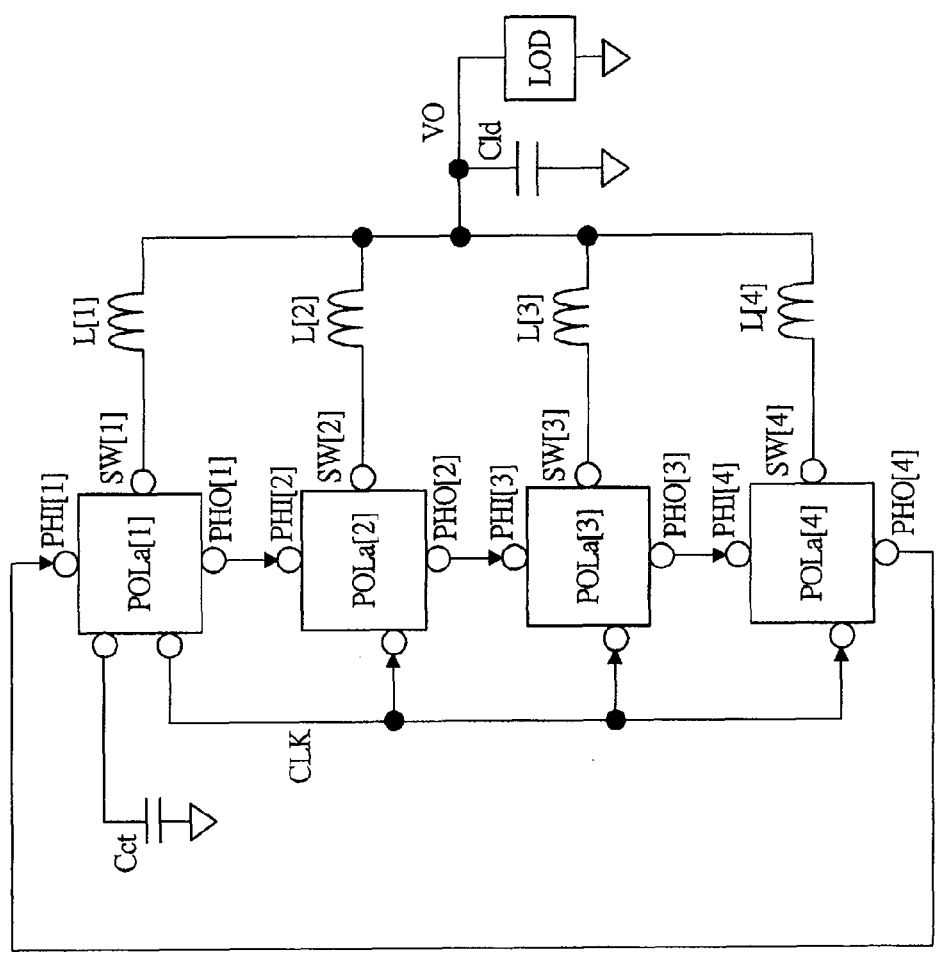
FIG. 20A shows another power source device studied as the prerequisite to the present invention, and is a block diagram showing an example of the outline configuration.

FIG. 18A shows a modification example of the oscillator circuit block of FIG. 3, and is a circuit block diagram of one configuration example. FIG. 18B shows a modification example of the oscillator circuit block of FIG. 3, and is a circuit block diagram of another configuration example. In FIG. 3 described above, the clock signal CLK is generated utilizing both the discharge time and the charge time, however, depending on circumstances, CLK can be also generated utilizing either the discharge time or the charge time (the charge time, in the example of FIG. 18A) as shown in FIG. 18A. That is, in the oscillator circuit block OSC_BKc shown in FIG. 18A, as compared with the oscillator circuit block OSC_BKa of FIG. 3, ISb and MN1 are replaced with an n-channel MOS transistor MN20, the clock signal generation circuit CKGa is replaced with a clock signal generation circuit CKGb, and furthermore, a switch SC40 is added to the gate of MN20.

CKGb outputs a one-shot 'H' pulse signal with a predetermined pulse width Tw as the clock signal CLK when the voltage level of the clock control signal CT exceeds the high-potential side threshold voltage Vh, and also outputs a one-shot 'H' pulse signal with a predetermined pulse width as a discharge signal DIS. This DIS is applied to the gate of MN20 when the switch SC40 is ON. In response to the master/slave control signal MS, SC40 is turned on in the case of the master device and turned off in the case of the slave device.

Accordingly, as shown in FIG. 18A, if the two oscillator circuit blocks OSC_BKc[1] and OSC_BKc[2] are coupled to the capacitor Cct, a charge operation is performed with 2×Ia on Cct, and when the voltage level of Cct reaches Vh, the charge operation is performed again after the charge of Cct is instantaneously discharged by MN20[1] in OSC_BKc[1]. When the number of connections of the oscillator circuit block OSC_BKc is n, the charge current becomes n×Ia and accordingly the frequency of CLK increases n times. However, in such a configuration example, due to the discharge operation of the capacitor Cct, the adjustment of the CLK frequency corresponding to the number of the connections of the oscillator circuit block may not be performed accurately. Moreover, the duty of CLK will vary with the number of the connections of the oscillator circuit block. In such a point of view, as shown in FIG. 3, a method utilizing both the discharge time and the charge time is preferably used.

Moreover, in FIG. 3 described above, the changeover switch (n-channel MOS transistor MN1) is provided in the constant current path on the ground power source voltage GND side, however, as shown in FIG. 18B, instead, a changeover switch (p-channel MOS transistor MP1) may be provided in the constant current path on the power source voltage VCIN side. In this case, contrary to the configuration example of FIG. 3, the constant current circuit ISb is provided on the VCIN side and the constant current circuit ISa is provided on the ground power source voltage GND side. Then, the turning on/off of MP1 provided on the VCIN side is controlled by the clock signal CLK. Furthermore, such a configuration may be conceived, wherein combining FIG. 3 and FIG. 18B, changeover switches are provided both on the power source voltage VCIN side and on the ground power source voltage GND side, and also an identical current is fed using a constant current circuit, and this changeover switch is exclusively controlled.

However, in such a configuration, a p-channel MOS transistor is required. Usually, the on-resistance of an n-channel MOS transistor is smaller than that of a p-channel MOS transistor, so the configuration as shown in FIG. 3 is preferable in order to achieve a reduction in the area or achieve high precision.

Moreover, for example, such a control method may be conceived, wherein in each oscillator circuit block OSC_BKa of FIG. 3, the constant current circuits ISa, ISb are replaced with variable-current circuits, the capacitor Cct is coupled only to the master device, and the currents Ia, Ib of ISa, ISb are increased n times in response to the number of phases. However, in this case, the information on the number of phases needs to be set in the master device, or the variable-current circuits are mounted in each semiconductor device, which leads to an increase in the size of the semiconductor device. From such a point of view, the configuration as shown in FIG. 3 is preferable.

What is claimed is:

1. A semiconductor device comprising:
   a first transistor and a second transistor constituting a high side transistor and a low side transistor of a DC/DC converter, respectively;
   a first node;
   a charge and discharge circuit including a constant current source which charges and discharges the first node and determines a charge rate or a discharge rate, and a changeover switch switching between charge and discharge;
   a clock signal generation circuit which generates a first clock signal by determining a voltage level of the first node;
   a second node for transmitting a common clock signal;
   a first switch which, when turned on, couples the clock signal generation circuit to the second node and transmits the first clock signal as the common clock signal;
   a third node to which a pulse input signal is input;
   a fourth node for outputting a pulse output signal;
   a pulse signal generation circuit which generates a delayed pulse signal by delaying the pulse input signal by a predetermined cycles of the common clock signal, and transmits the delayed pulse signal as the pulse output signal; and
   a PWM control circuit which controls switching of the first and second transistors using a PWM signal, with the pulse input signal or the pulse output signal as a starting point.

2. The semiconductor device according to claim 1,
   wherein the charge and discharge circuit includes:
   a first constant current source provided between the first node and a high-potential side power supply voltage; and
   the changeover switch and a second constant current source provided in series between the first node and a low-potential side power supply voltage;
   wherein turning on/off of the changeover switch is controlled by the common clock signal; and
   wherein when a voltage level of the first node reaches a high-potential side threshold voltage and a low-potential side threshold voltage, the clock signal generation circuit causes an output voltage level thereof to transition, respectively, thereby generating the first clock signal.

3. The semiconductor device according to claim 1, further comprising:
   a second switch which, when turned on, couples the charge and discharge circuit to the first node; and
   a selection switch circuit which selects whether to transmit the pulse input signal as the pulse output signal or to transmit the delayed pulse signal as the pulse output signal.

4. The semiconductor device according to claim 3,
   wherein the first and second transistors supply an electric power to an external load via an external inductor,
   wherein the PWM control circuit turns on the first transistor and turns off the second transistor, respectively, with the pulse input signal or the pulse output signal as a starting point, and
   wherein when a current flowing through the first transistor reaches a determination level which reflects a detection result of the external load with respect to the power source, the PWM control circuit turns off the first transistor and turns on the second transistor, respectively.

5. The semiconductor device according to claim 4, further comprising an enable detection circuit which detects a magnitude of the determination level to control activation/deactivation of an enable signal,
   wherein when the enable signal is activated, the second switch is turned on and the selection switch circuit transmits the delayed pulse signal as the pulse output signal, while when the enable signal is deactivated, the second switch is turned off and the selection switch circuit transmits the pulse input signal as the pulse output signal.

6. The semiconductor device according to claim 1,
   wherein the first to fourth nodes are external terminals, and
   wherein the semiconductor device is mounted in one semiconductor package.

7. A semiconductor device, comprising:
   a first transistor and a second transistor constituting a high side transistor and a low side transistor of a DC/DC converter, respectively, and supplying an electric power to an external load;
   a first node;
   a charge and discharge circuit including a constant current source which charges and discharges the first node and determines a charge rate or a discharge rate, and a changeover switch switching between charge and discharge;
   a clock signal generation circuit which generates a first clock signal by determining a voltage level of the first node;
   a second node for transmitting a common clock signal;
   a first switch which, when turned on, couples the clock signal generation circuit to the second node and transmits the first clock signal as the common clock signal;

a third node to which a pulse input signal is input;
a fourth node for outputting a pulse output signal;
a pulse signal generation circuit which generates a delayed pulse signal by delaying the pulse input signal by a predetermined cycles of the common clock signal, and transmits the delayed pulse signal as the pulse output signal; and
a PWM control circuit which controls switching of the first and second transistors using a PWM signal,
wherein the PWM control circuit includes:
  a fifth node serving as a detecting node of the external load with respect to a power source voltage;
  an error amplifier circuit which amplifies a voltage level of the fifth node with reference to a reference voltage level, and outputs an error amplifier signal;
  a sixth node to which a determination voltage level is transmitted;
  a conduction control circuit which controls conduction/non-conduction between an output node of the error amplifier circuit and the sixth node;
  a current detection circuit which detects a current flowing through the first transistor and generates a current detection signal by converting this current to a voltage;
  a first comparator circuit which outputs a first signal when the current detection signal reaches the determination voltage level; and
  a latch circuit which causes a PWM signal to transition to an on-level with the pulse input signal or the pulse output signal as a starting point, and causes the PWM signal to transition to an off-level with the first signal as a starting point, and
wherein when the PWM signal is at an on-level, the first transistor is turned on and the second transistor is turned off, respectively, and when the PWM signal is at an off-level, the first transistor is turned off and the second transistor is turned on, respectively.

8. The semiconductor device according to claim 7, further comprising a master/slave detection circuit which outputs a slave signal when a voltage level of the fifth node is higher than a first voltage level, and outputs a master signal when it is lower than the first voltage level,
wherein the fifth node is coupled to a power source node of the external load, or is applied with a fixed voltage higher than the first voltage level, and
wherein the first switch is turned on in response to the master signal, and is turned off in response to the slave signal.

9. The semiconductor device according to claim 7, further comprising:
a second switch which, when turned on, couples the charge and discharge circuit to the first node; and
a first selection switch circuit which selects whether to transmit the pulse input signal as the pulse output signal or to transmit the delayed pulse signal as the pulse output signal,
wherein the second switch is turned on when an enable signal is in an active state, and is turned off when in an inactive state, and
wherein the first selection switch circuit transmits the delayed pulse signal as the pulse output signal when the enable signal is in an active state, and transmits the pulse input signal as the pulse output signal when in an inactive state.

10. The semiconductor device according to claim 9, further comprising an enable detection circuit which determines a magnitude of the determination voltage level of the sixth node by a hysteresis comparator, and controls activation/deactivation of the enable signal according to its determination result.

11. The semiconductor device according to claim 10, further comprising: a seventh node; and a second selection switch circuit which selects whether to couple the seventh node to an output node of the error amplifier circuit or to the hysteresis comparator,
wherein a hysteresis characteristic of the hysteresis comparator can be variably set by an external element coupled to the seventh node.

12. The semiconductor device according to claim 7,
wherein the first to sixth nodes are external terminals, and
wherein the semiconductor device is mounted in one semiconductor package.

13. A power source device, comprising:
first to m-th (m is an integer of 2 or more) semiconductor devices;
first to m-th inductors each having one end commonly coupled to an output power source node; and
an external capacitor,
wherein the first semiconductor device includes a first charge and discharge terminal, a first clock terminal, a first output terminal, a first pulse input terminal, and a first pulse output terminal,
wherein the m-th semiconductor device includes an m-th charge and discharge terminal, an m-th clock terminal, an m-th output terminal, an m-th pulse input terminal, and an m-th pulse output terminal,
wherein the first to m-th charge and discharge terminals are commonly coupled to one end of the external capacitor,
wherein the first to m-th clock terminals are commonly coupled to each other, and transmit a common clock signal,
wherein the first to m-th output terminals are coupled to the other ends of the first to m-th inductors, respectively,
wherein the first pulse input terminal is coupled to the m-th pulse output terminal,
wherein a k-th (k is an integer, $1 \leq k \leq (m-1)$) pulse output terminal is sequentially coupled to a (k+1)-th pulse input terminal,
wherein the first semiconductor device further includes:
  a first high side transistor having one end coupled to the first output terminal;
  a first low side transistor having one end coupled to the first output terminal;
  a first charge and discharge circuit including a first constant current source which charges and discharges the first charge and discharge terminal and determines a charge rate or a discharge rate, and a first changeover switch switching between charge and discharge;
  a first clock signal generation circuit which generates a first clock signal by determining a voltage level of the first charge and discharge terminal;
  a first clock switch which, when turned on, couples the first clock signal generation circuit to the first clock terminal;
  a first pulse signal generation circuit which generates a first pulse output signal by delaying a first pulse input signal input from the first pulse input terminal by a predetermined cycles of the common clock signal, and transmits the first pulse output signal to the first pulse output terminal; and
  a first PWM control circuit which controls switching of the first high side transistor and the first low side transistor using a first PWM signal, with the first pulse input signal or the first pulse output signal as a starting point, wherein the m-th semiconductor device further includes:
an m-th high side transistor having one end coupled to the m-th output terminal:
an m-th low side transistor having one end coupled to the m-th output terminal:
an m-th charge and discharge circuit including an m-th constant current source which charges and discharges the m-th charge and discharge terminal and determines a charge rate or a discharge rate, and an m-th changeover switch switching between charge and discharge:
an m-th clock signal generation circuit which generates an m-th clock signal by determining a voltage level of the m-th charge and discharge terminal:
an m-th clock switch which, when turned on, couples the m-th clock signal generation circuit to the m-th clock terminal:
an m-th pulse signal generation circuit which generates an m-th pulse output signal by delaying an m-th pulse input signal input from the m-th pulse input terminal by a predetermined cycles of the common clock signal, and transmits the m-th pulse output signal to the m-th pulse output terminal: and
an m-th PWM control circuit which controls switching of the m-th high side transistor and the m-th low side transistor using an m-th PWM signal, with the m-th pulse input signal or the m-th pulse output signal as a starting point,
wherein the first clock switch is turned on and the m-th clock switch is turned off, and thereby the first clock signal is transmitted as the common clock signal, and
wherein current values of the first to m-th constant current sources are all equal.

14. The power source device according to claim 13,
wherein the first charge and discharge circuit includes:
a first high-potential side constant-current source provided between the first charge and discharge terminal and a high-potential side power supply voltage; and
the first changeover switch and a first low-potential side constant-current source provided in series between the first charge and discharge terminal and a low-potential side power supply voltage,
wherein turning on/off of the first changeover switch is controlled by the common clock signal,
wherein the m-th charge and discharge circuit includes:
an m-th high-potential side constant-current source provided between the m-th charge and discharge terminal and a high-potential side power supply voltage; and
the m-th changeover switch and an m-th low-potential side constant-current source provided in series between the m-th charge and discharge terminal and a low-potential side power supply voltage, and
wherein turning on/off of the m-th changeover switch is controlled by the common clock signal.

15. The power source device according to claim 13,
wherein the first semiconductor device further includes:
a first clock control switch which couples the first charge and discharge circuit to the first charge and discharge terminal when a first enable signal is in an active state; and
a first pulse selection switch circuit which transmits the first pulse output signal from the first pulse signal generation circuit to the first pulse output terminal when the first enable signal is in an active state, and transmits the first pulse input signal to the first pulse output terminal when the first enable signal is in an inactive state, wherein the m-th semiconductor device further includes:
an m-th clock control switch which couples the m-th charge and discharge circuit to the m-th charge and discharge terminal when an m-th enable signal is in an active state; and
an m-th pulse selection switch circuit which transmits the m-th pulse output signal from the m-th pulse signal generation circuit to the m-th pulse output terminal when the m-th enable signal is in an active state, and transmits the m-th pulse input signal to the m-th pulse output terminal when the m-th enable signal is in an inactive state.

16. The power source device according to claim 15,
wherein the first semiconductor device further includes a first determination level terminal and a first feedback terminal,
wherein the m-th semiconductor device further includes an m-th determination level terminal and an m-th feedback terminal,
wherein the first to m-th determination level terminals are commonly coupled to each other and transmit a common determination voltage level,
wherein the first feedback terminal is coupled to the output power source node,
wherein a predetermined fixed voltage is applied to the m-th feedback terminal,
wherein the first PWM control circuit includes:
a first error amplifier circuit which detects a voltage level of the first feedback terminal, and outputs a first determination voltage level reflecting this detection result;
a first conduction control circuit which controls conduction/non-conduction between an output node of the first error amplifier circuit and the first determination level terminal;
a first current detection circuit which detects a current flowing through the first high side transistor and generates a first current detection signal by converting this current to a voltage;
a first comparator circuit which outputs a first signal when the first current detection signal reaches the common determination voltage level; and
a first latch circuit which causes the first PWM signal to transition to an on-level with the first pulse input signal or the first pulse output signal as a starting point, and causes the first PWM signal to transition to an off-level with the first signal as a starting point,
wherein the m-th PWM control circuit includes:
an m-th error amplifier circuit which detects a voltage level of the m-th feedback terminal, and outputs an m-th determination voltage level reflecting this detection result;
an m-th conduction control circuit which controls conduction/non-conduction between an output node of the m-th error amplifier circuit and the m-th determination level terminal;
an m-th current detection circuit which detects a current flowing through the m-th high side transistor and generates an m-th current detection signal by converting this current to a voltage;
an m-th comparator circuit which outputs an m-th signal when the m-th current detection signal reaches the common determination voltage level; and
an m-th latch circuit which causes the m-th PWM signal to transition to an on-level with the m-th pulse input signal or the m-th pulse output signal as a starting point, and causes the m-th PWM signal to transition to an off-level with the m-th signal as a starting point; and wherein the first conduction control circuit is controlled to a conduction state, and the m-th conduction control circuit is controlled to a non-conduction state.

17. The power source device according to claim 16, wherein the first semiconductor device further includes a first enable detection circuit which determines a magnitude of the common determination voltage level using a first hysteresis comparator, and controls activation/deactivation of the first enable signal according to this determination result, and wherein the m-th semiconductor device further includes an m-th enable detection circuit which determines a magnitude of the common determination voltage level using an m-th hysteresis comparator, and controls activation/deactivation of the m-th enable signal according to this determination result.

* * * * *